(12) United States Patent
Shin et al.

(10) Patent No.: US 8,686,573 B2
(45) Date of Patent: Apr. 1, 2014

(54) SEMICONDUCTOR DEVICE

(71) Applicant: Renesas Electronics Corporation, Kawasaki (JP)

(72) Inventors: Shiko Shin, Kanagawa (JP); Takayuki Saito, Kanagawa (JP); Hiroshi Horibe, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/767,267

(22) Filed: Feb. 14, 2013

(65) Prior Publication Data

US 2013/0234309 A1   Sep. 12, 2013

(30) Foreign Application Priority Data

Mar. 8, 2012   (JP) .................................. 2012-051546

(51) Int. Cl.
*H01L 23/48*   (2006.01)
*H01L 29/40*   (2006.01)
*H01L 23/52*   (2006.01)

(52) U.S. Cl.
USPC ......................................... 257/784; 257/781

(58) Field of Classification Search
USPC ........................ 257/784, 786, 780, 781, 787
See application file for complete search history.

(56) References Cited

U.S. PATENT DOCUMENTS

| | | | | |
|---|---|---|---|---|
| 6,906,386 | B2* | 6/2005 | Williams et al. | 257/355 |
| 7,417,295 | B2* | 8/2008 | Kushiyama et al. | 257/459 |
| 7,420,266 | B2* | 9/2008 | Takahashi | 257/669 |
| 2003/0151149 | A1 | 8/2003 | Ichikawa | |
| 2004/0155333 | A1* | 8/2004 | Yang et al. | 257/734 |
| 2010/0149773 | A1* | 6/2010 | Said | 361/783 |
| 2012/0068218 | A1* | 3/2012 | Chang et al. | 257/99 |
| 2013/0045550 | A1* | 2/2013 | Park et al. | 438/27 |

FOREIGN PATENT DOCUMENTS

JP   2003-243443 A   8/2003

* cited by examiner

*Primary Examiner* — S. V. Clark
(74) *Attorney, Agent, or Firm* — Miles & Stockbridge P.C.

(57) ABSTRACT

Technique capable of achieving reliability improvement of a semiconductor device even if temperature rising of an operation guarantee temperature of the semiconductor device is performed is provided. Gap portions are provided among a plurality of pads, and a glass coat composed of, for example, a silicon oxide film or a silicon nitride film is embedded in the gap portions. The glass coat is provided in order to secure electrical insulation among the pads, and coats outer edge portions of the pads. Trenches are formed so as to be adjacent to regions, which are coated with the glass coat, of the outer edge portions of the pads.

24 Claims, 26 Drawing Sheets

US 8,686,573 B2

SEMICONDUCTOR DEVICE

CROSS-REFERENCE TO RELATED APPLICATION

The present application claims priority from Japanese Patent Application No. 2012-051546 filed on Mar. 8, 2012, the content of which is hereby incorporated by reference into this application.

TECHNICAL FIELD OF THE INVENTION

The present invention relates to a semiconductor device. The present invention particularly relates to technique effectively used in a semiconductor device which electrically connects a terminal formed to a wiring member and a semiconductor chip mounted on the wiring member to each other using a metal wire.

BACKGROUND OF THE INVENTION

Japanese Patent Application Laid-Open No. 2003-243443 (Patent Document 1) describes technique for providing a semiconductor device having a pad excellent in adhesiveness according to a simple manufacturing process. Specifically, the semiconductor device is provided with a pad for connection of a gold wire serving as a bonding wire. The pad is formed on a flat surface of an insulating layer and a plurality of recesses are formed on a connection region of the pad connected with a ball portion.

SUMMARY OF THE INVENTION

The semiconductor device is composed of a semiconductor chip on which a semiconductor element such as a MOSFET (Metal Oxide Semiconductor Field Effect Transistor) and a multilayer interconnection are formed, and a package formed so as to cover the semiconductor chip. The package has (1) a function of electrically connecting the semiconductor element formed on the semiconductor chip and an external circuit to each other and (2) a function of protecting the semiconductor chip from external environment such as moisture or temperature and preventing breakage due to vibrations or an impact or characteristic deterioration of the semiconductor chip. Further, the package also has (3) a function of facilitating handling of the semiconductor chip, (4) a function of radiating heat generated during operation of the semiconductor chip to maximize the function of the semiconductor element, and the like.

In the package, for example, the semiconductor chip is mounted on the wiring member and the pad formed on the semiconductor chip and the a terminal formed on the wiring member are connected to each other by a wire in order to realize the function of electrically connecting the semiconductor element formed on the semiconductor chip and the external circuit. That is, connection between the pad and the terminal is made by the wire, for example, through a ball.

In the semiconductor device thus configured, the temperature of the semiconductor device rises due to heat generation during operation of the semiconductor chip, but even in this case, the semiconductor device is required to operate normally within a certain specified temperature range. In particular, a semiconductor device used in an automobile product is frequently required to provide an operation guarantee at a higher temperature than an operation guarantee temperature of a general-use semiconductor device because a large amount of current may be caused to flow in the former in a short period of time and the former is frequently disposed around an engine room which reaches a high temperature. For example, temperature of 125° C. was conventionally frequently required as an operation guarantee temperature of a semiconductor device used in the automobile product, but a temperature of 150° C., or a temperature of 175° C. in a higher case, is required as the operation guarantee temperature in recent years.

However, in the current connection structure using a wire via a ball for connection between a pad and a terminal, the inventors of the present invention have newly found that the problems described below become apparent according to rising of the temperature of the semiconductor device. That is, in the current connection structure, a material forming the ball becomes easy to diffuse in a material forming the pad according to rising of the temperature, which results in formation of an alloy layer of the material forming the ball and the material forming the pad in the pad. When the temperature of the semiconductor device is retained at a high temperature, the alloy layer grows to break through an insulating film (glass coat) provided between pads for insulation so that such an event that the alloy layer reaches an adjacent pad or alloy layers which have grown from respective pads adjacent to each other to come in contact with each other occurs. In this case, the pads adjacent to each other are electrically connected to each other, which results in short-circuit defect. Especially, in recent years, the high functionality and size reduction of the semiconductor device are promoted, and a distance between pads adjacent to each other becomes short according to the promotion, which results in such a situation that short-circuit defect easily occurs. That is, there is the situation where short-circuit defect occurs easily due to a joint result of the operation guarantee at a high temperature and narrowing of a pitch between pads.

A preferred aim of the present invention is to provide technique capable of achieving reliability improvement of a semiconductor device even when temperature rising of the operation guarantee temperature of the semiconductor device has been performed.

The above and other preferred aims and novel characteristics of the present invention will be apparent from the description of the present specification and the accompanying drawings.

The typical ones of the inventions disclosed in the present application will be briefly described as follows.

According to an embodiment of the present invention, a metal wire is electrically connected to a first pad via a metal ball, and a trench is formed in a portion of a surface of the first pad sandwiched between the above-described metal ball and a second pad arranged adjacent to the first pad as viewed in plan.

The effects obtained by typical aspects of the present invention will be briefly described below.

According to the embodiment, even if temperature rising of the operation guarantee temperature of the semiconductor device is performed, reliability improvement of the semiconductor device can be achieved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Moreover, in some drawings for describing in the embodiments, hatching is used even in a plan view so as to make the drawings easy to see.

First Embodiment

<Configuration Example of Semiconductor Device (BGA Package)>

As a package structure of a semiconductor device, there are various kinds of ones such as, for example, a BGA (Ball Grid Array) package or a QFP (Quad Flat Package) package. The technical idea of the present invention can be adopted to these packages, and a configuration example of a semiconductor device formed in the BGA package and a configuration example of a semiconductor device formed in the QFP package will be described below.

Figure 1:
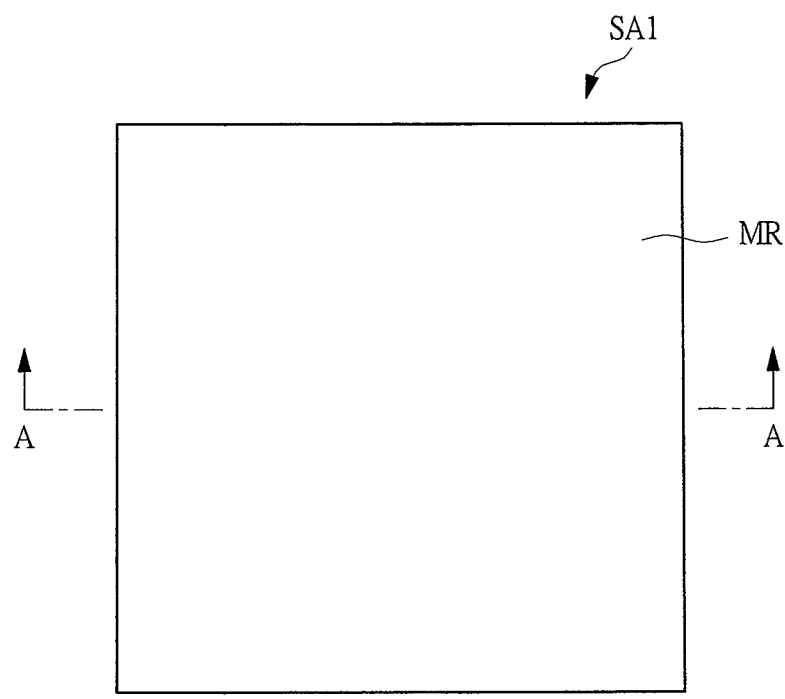
FIG. 1 is a plan view of a semiconductor device formed in a BGA package as viewed from above.

First, the configuration example of a semiconductor device formed in the BGA package will be described with reference to the drawings. FIG. 1 is a plan view of a semiconductor device SA1 formed in a BGA package as viewed from above. As illustrated in FIG. 1, the semiconductor device SA1 according to the present embodiment is formed in a rectangular shape, and an upper surface of the semiconductor device SA1 is covered with a resin (sealing body) MR.

Figure 2:
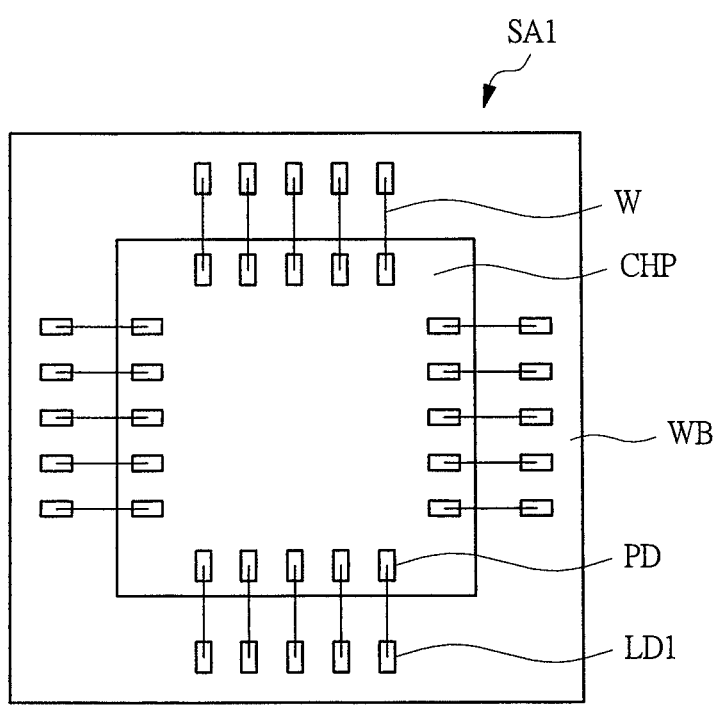
FIG. 2 is a diagram of the semiconductor device as viewed through a resin from above.

Subsequently, FIG. 2 is a diagram of the semiconductor device SA1 illustrating the resin MR viewed from above in a perspective manner. As illustrated in FIG. 2, a rectangular wiring board WB is provided inside the semiconductor device SA1 when viewing the resin MR in a perspective manner, and a semiconductor chip CHP is placed on the wiring board WB. The semiconductor chip CHP is also formed in a rectangular shape. The size of the semiconductor chip CHP is made smaller than that of the wiring board WB, and the semiconductor chip CHP is placed to be embedded in the wiring board WB in a plan view. In particular, such an arrangement is adopted that four sides of the semiconductor chip CHP are parallel to fours sides of the wiring board WB, respectively.

An integrated circuit is formed to the above-described semiconductor chip CHP. Specifically, semiconductor elements such as a plurality of MOSFETs are formed on a semiconductor substrate included in the semiconductor chip CHP. Multilayered wirings are formed on an upper layer of the semiconductor substrate through interlayer insulating films, and these multilayered wirings are electrically connected to the plurality of MOSFETs formed on the semiconductor substrate so that the integrated circuit is configured. That is, the semiconductor chip CHP has the semiconductor substrate including the plurality of MOSFETs and the multilayered wirings formed above the semiconductor substrate. Though the semiconductor chip CHP is provided with the integrated circuit composed of the plurality of MOSFETs and the multilayered wirings in this manner, pads PD are formed on the semiconductor chip CHP in order to cause the integrated circuit and an external circuit to interface with each other. The pads PD are formed by exposing portions of an uppermost layer wiring formed on an uppermost layer of the multilayered wirings.

As illustrated in FIG. 2, a plurality of pads PD are formed on a main surface (a surface, an upper surface) of the semiconductor chip CHP. Specifically, the plurality of pads PD are formed along respective four sides of the semiconductor chip CHP formed in a rectangular shape. A plurality of land terminals LD1 are formed along respective four sides of the wiring board WB so as to correspond to the plurality of pads PD formed on the semiconductor chip CHP. The pads PD formed on the semiconductor chip CHP are electrically connected to the land terminals LD1 formed on the wiring board WB via conductive members. Incidentally, the conductive members in the present embodiment are, for example, wires W made of gold (Au).

Figure 3:
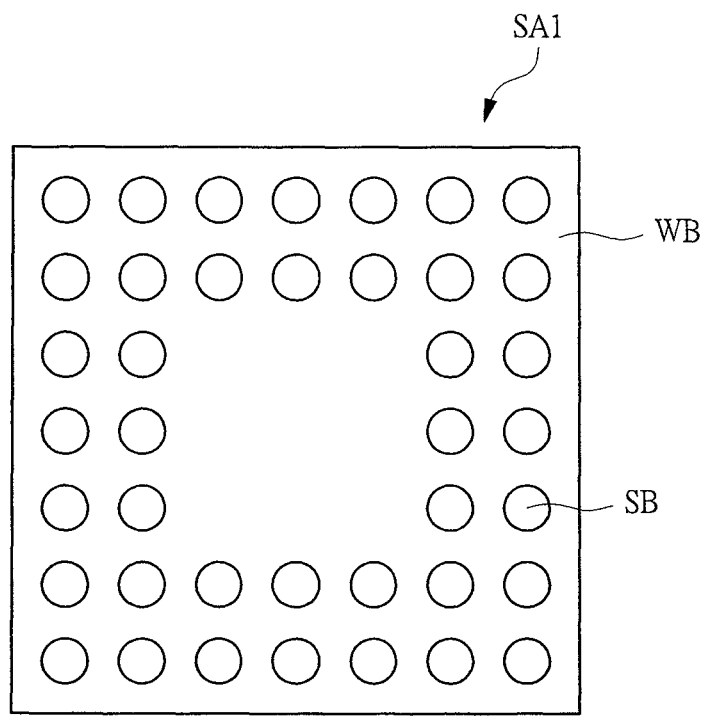
FIG. 3 is a semiconductor device according to a first embodiment as viewed from a back surface of the semiconductor device.

Next, FIG. 3 is a diagram of the semiconductor device SA1 according to the first embodiment as viewed from a back surface of the semiconductor device SA1. As illustrated in FIG. 3, a plurality of solder balls SB are arranged on the back surface of the semiconductor device SA1 in an array (matrix) manner. The solder balls SB function as external connection terminals of the semiconductor device SA1.

Figure 4:
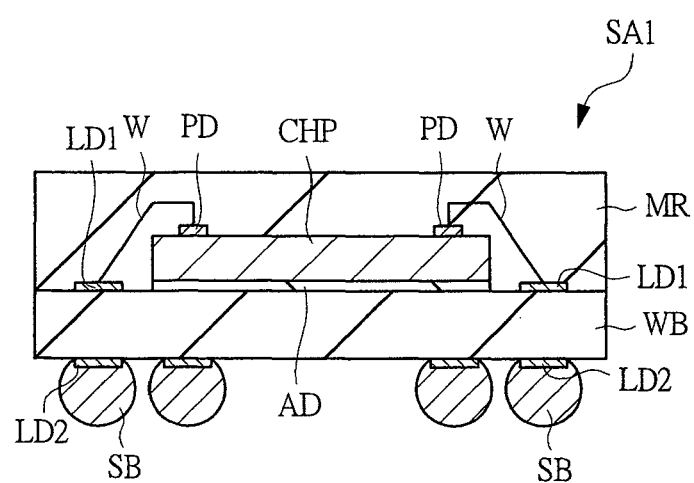
FIG. 4 is a cross-sectional view of the semiconductor device taken along line A-A in FIG. 1.

FIG. 4 is a cross-sectional view of the semiconductor device SA1 taken along the line A-A in FIG. 1. In FIG. 4, the land terminals LD1 are formed on the upper surface of the wiring board WB, while terminals (bump lands, electrodes) LD2 are formed on a lower face of the wiring board WB. Multi-layer wirings and via holes are formed inside the wiring board WB, and the land terminals LD1 formed on the upper surface of the wiring board WB and the terminals LD2 formed on the lower face of the wiring board WB are electrically connected by the multi-layer wirings inside the wiring board WB and via hole wirings inside the via holes. The terminals LD2 formed on the lower face of the wiring board WB are arranged in an array manner, and the solder balls (ball terminals) SB are mounted on the terminals LD2. Thereby, the solder balls SB connected to the terminals LD2 are arranged on a back surface (lower face) of the wiring board WB in an array manner.

The semiconductor chip CHP is mounted on an upper surface (a surface, a main surface) of the wiring board WB, and it is caused to adhere to the wiring board WB by insulating adhesive AD. The pads PD formed on the main surface of the semiconductor chip CHP and the land terminals LD1 formed on the upper surface of the wiring board WB are connected by the wires W. Further, the resin (sealing body) MR is formed on an upper surface of the wiring board WB so as to cover the semiconductor chip CHP and the wires W.

According to the semiconductor device SA1 thus configured, the pads PD formed on the semiconductor chip CHP are connected to the land terminals LD1 formed on the wiring board WB via the wires W, and the land terminals LD1 are electrically connected to the terminals LD2 formed on the back surface of the wiring board WB by wires and via hole wires formed inside the wiring board WB. Therefore, it is understood that the integrated circuit formed in the semiconductor chip CHP is finally connected to the solder balls SB through a route of the pads PD→the wires W→the land terminals LD1→the terminals LD2→the solder balls SB. From this, it is understood that, by electrically connecting an external circuit to the solder balls SB formed on the semiconductor device SA1, the integrated circuit formed on the semiconductor chip CHP and the external circuit can be connected to each other.

<Manufacturing Method of the Semiconductor Device (BGA Package)>

Figure 5:
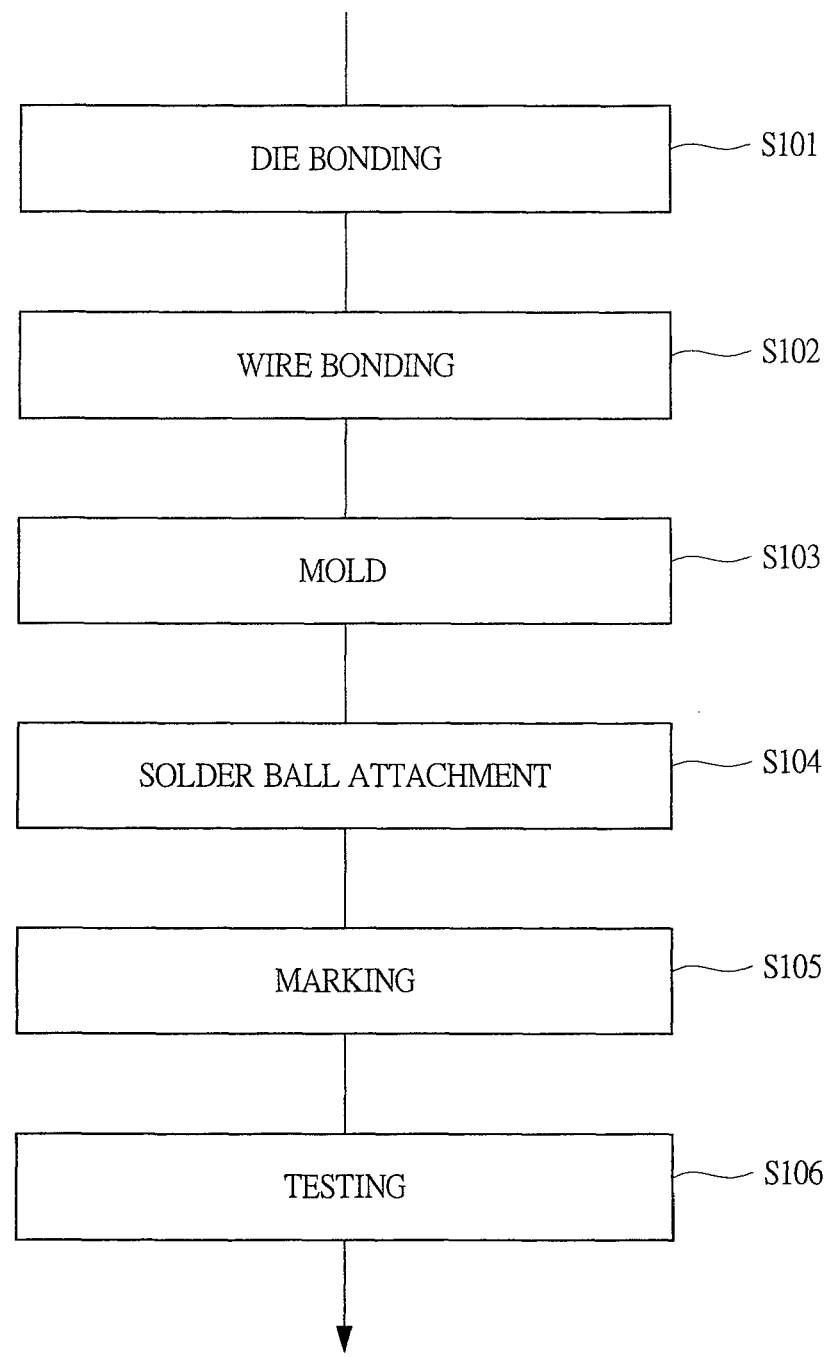
FIG. 5 is a flowchart illustrating a flow of steps of manufacturing a semiconductor device formed in the BGA package.

The semiconductor device SA1 formed in the BGA package is configured in the above-described manner and a manufacturing method of the semiconductor device SA1 will be briefly described below. FIG. 5 is a flowchart illustrating a flow of steps for manufacturing a semiconductor device SA1 composed of a BGA package.

First, semiconductor elements (MOSFETs), multi-layer wirings, and pads are formed on respective regions of a semiconductor substrate (a semiconductor wafer). After the thickness of the semiconductor device is made thin by performing back surface polishing of the semiconductor substrate, a plurality of semiconductor chips are formed by dicing in accordance with chip regions formed on the semiconductor substrate.

Next, a wiring board having a surface on which a plurality of land terminals are formed and a back surface opposed to the surface, on which a plurality of terminals are formed is prepared. An adhesive is applied to a chip-mounting portion (chip-mounting region) provided on a surface of the wiring board. Thereafter, a semiconductor chip is mounted on the chip-mounting portion of the wiring board via the applied adhesive (die bonding step) (S101).

Subsequently, the pads formed on the semiconductor chip and the land terminals formed on the wiring board are connected by wires (wire bonding step) (S102). Specifically, first, bonding is performed by pressing a capillary onto the pads formed on the semiconductor chip (first bonding). Thereafter, the capillary is moved and wires are bonded to the land terminals formed on the wiring board (second bonding). In this manner, the pads formed on the semiconductor chip and the land terminals formed on the wiring board can be connected by the wires.

Next, a sealing body made of, for example, resin is formed so as to cover the semiconductor chip, the wires and the surface of the wiring board (molding step) (S103). Thereafter, for example, solder balls made of solder (external connection terminals) are attached to the terminals formed on the back surface of the wiring board (solder ball-attaching step) (S104). Then, for example, a mark composed of a manufacture number or the like is impressed (indented) by laser (marking step) (S105). Sorting about whether the semiconductor device SA1 thus manufactured is a good product or a defective product is performed by performing final inspection (testing step) (S106), so that the semiconductor device SA1 which is determined as a good product is shipped.

The semiconductor device SA1 described above is the semiconductor device formed in the BGA package, but the aspect of the package to which the technical idea of the present invention can be adopted is not limited to this. For example, the technical idea of the present invention can be adopted to an aspect of a package using a chip-mounting portion separated from lead terminals as a semiconductor chip-mounting base material (a wiring board) instead of the wiring board. Specifically, the technical idea of the present invention can be widely adopted to even a QFP package or a QFN package. In particular, a configuration example of a semiconductor device formed in a QFP package will be described below.

<Configuration Example of a Semiconductor Device (QFP Package)>

Figure 6:
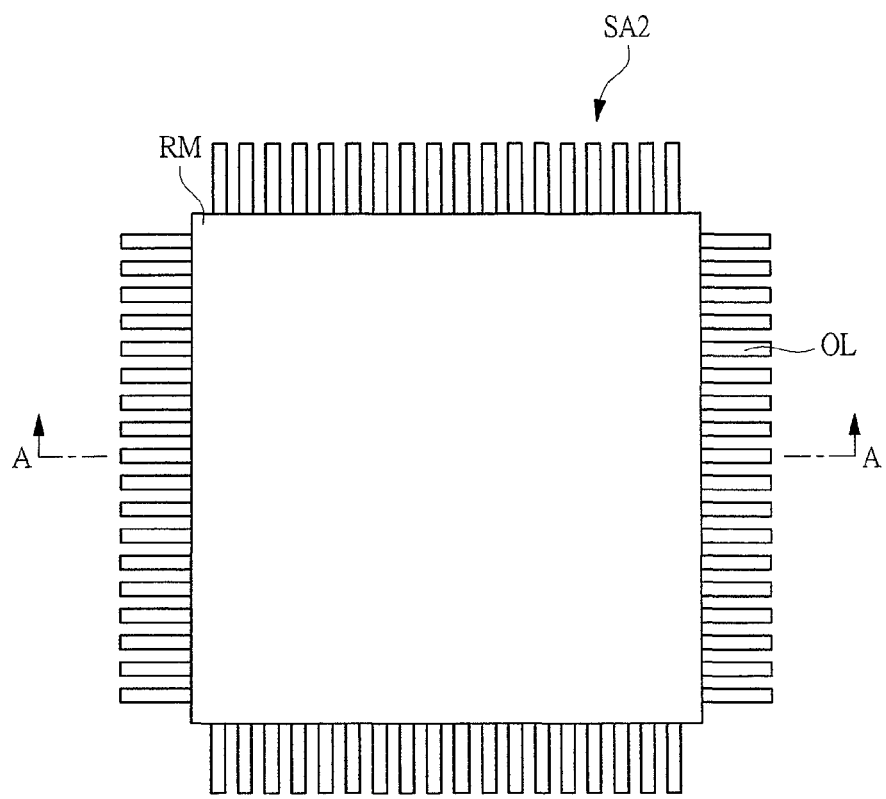
FIG. 6 is a plan view of a semiconductor device formed in a QFP package as viewed from above.

First, a configuration of a semiconductor device formed in a QFP package will be described with reference to the drawings. FIG. 6 is a plan view of a semiconductor device SA2 formed in a QFP package as viewed from above. As illustrated in FIG. 6, the semiconductor device SA2 is formed in a rectangular shape, and an upper surface of the semiconductor device SA2 is covered with a resin (sealing body) RM. Outer leads OL project outward from four sides defining an outer shape of the resin RM.

Figure 7:
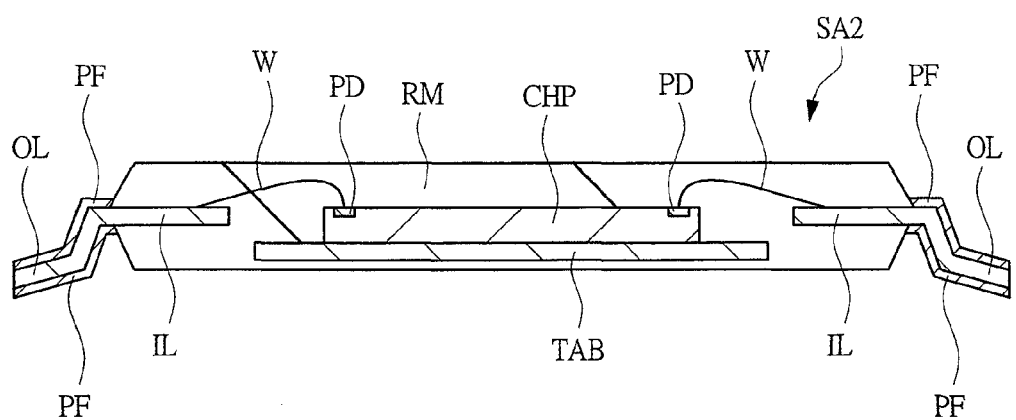
FIG. 7 is a cross-sectional view of the semiconductor device taken along the line A-A in FIG. 6.

Subsequently, an internal structure of the semiconductor device SA2 will be described. FIG. 7 is a cross-sectional view of the semiconductor device SA2 taken along the line A-A in FIG. 6. As illustrated in FIG. 7, a back surface of a chip-mounting portion TAB is covered with the resin RM. On the other hand, a semiconductor chip CHP is mounted on an upper surface of the chip-mounting portion TAB, and the chip-mounting portion TAB is separated from inner leads IL (lead terminals). Pads PD are formed on a main surface of the semiconductor chip CHP. The pads PD formed on the semiconductor chip CHP are electrically connected to the inner leads IL by wires W. The semiconductor chip CHP, the wires W, and the inner leads IL are covered with the resin RM, and outer leads OL (lead terminals) integrated with the inner leads IL project from the resin RM. The outer leads OL projecting from the resin RM are formed in a gull-wing shape and plating films PF are formed on surfaces of the projecting portions of the outer leads OL.

The chip-mounting portion TAB, the inner leads IL, and the outer leads OL are formed of, for example, 42 Alloy which is an alloy of a copper material or iron and nickel, or the like, and the wires W are formed of, for example, gold wires. The semiconductor chip CHP is formed of, for example, silicon or a compound semiconductor (GaAs or the like), and a plurality of semiconductor elements such as MOSFETs are formed on the semiconductor chip CHP. Multi-layer wirings are formed above the semiconductor elements via interlayer insulating films, and the pads PD connected to the multi-layer wirings are formed on an uppermost layer of the multi-layer wirings. Therefore, the semiconductor elements formed on the semiconductor chip CHP are electrically connected to the pads PD via the multi-layer wirings. That is, the integrated circuit is composed of the semiconductor elements formed on the semiconductor chip CHP and the multi-layer wirings, and the pads PD serve as terminals for connecting the integrated circuit and the outside of the semiconductor chip CHP. The pads PD are connected to the inner leads IL by the wires W, and they are connected to the outer leads OL integrated with the inner leads IL. From this, it is understood that the integrated circuit formed on the semiconductor chip CHP can be electrically connected to the outside of the semiconductor device SA2 through a route of the pads PD→the wires W→the inner leads IL→the outer leads OL→an external connection device. That is, it is understood that the integrated circuit formed on the semiconductor chip CHP can be controlled by inputting electric signals from the outer leads OL formed on the semiconductor device SA2. Further, it is understood that output signals from the integrated circuit can also be fetched to the outside.

<Manufacturing Method of the Semiconductor Device (QFP Package)>

Figure 8:
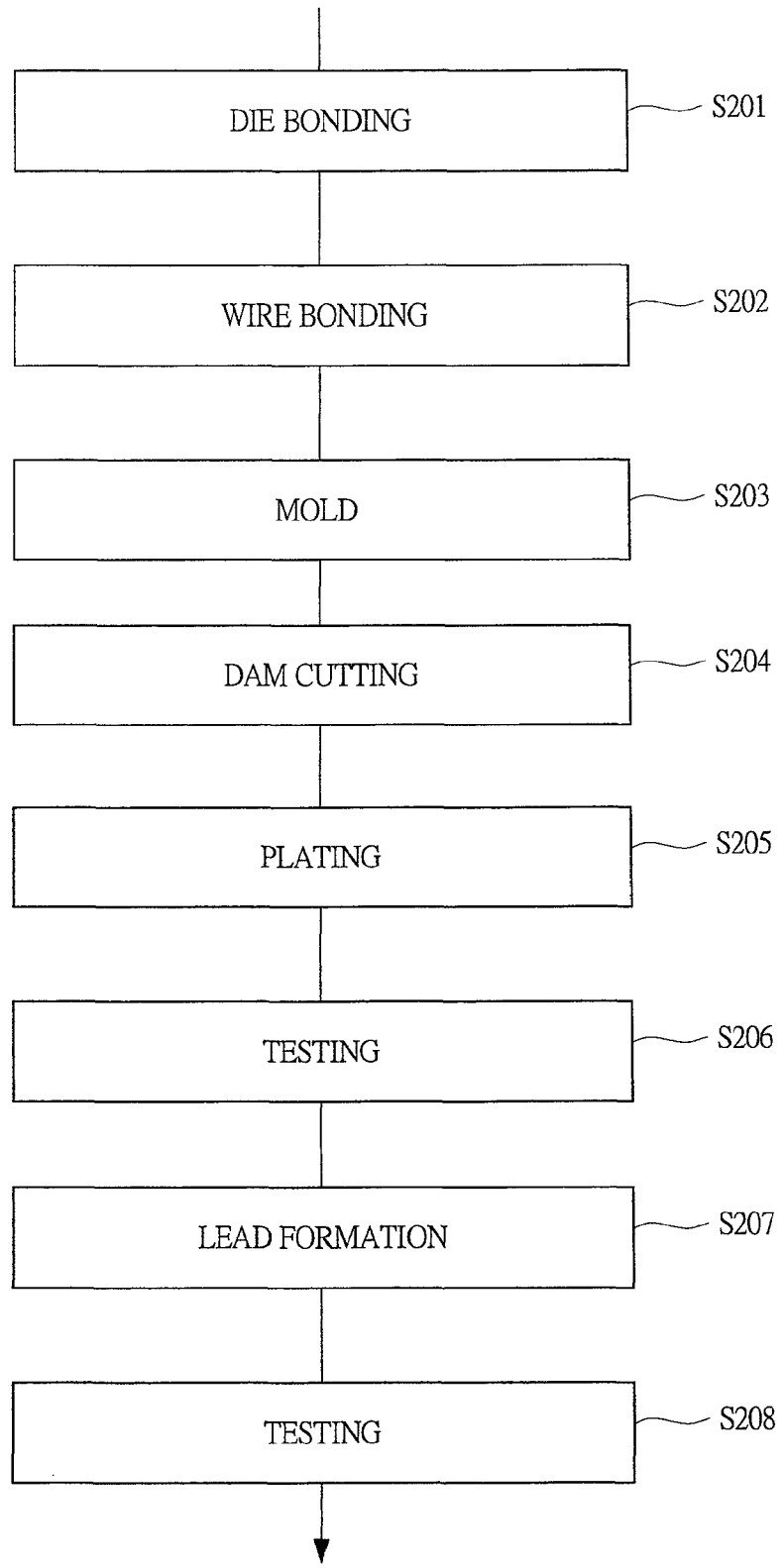
FIG. 8 is a flowchart illustrating a flow of steps of manufacturing a semiconductor device formed in a QFP package after an integrated circuit is formed on a semiconductor chip.

The semiconductor device SA2 formed in the QFP package is configured in the above-described manner, and a manufacturing method thereof will be briefly described below. FIG. 8 is a flowchart illustrating a flow of steps of manufacturing a semiconductor device formed in a QFP package after an integrated circuit has been formed on a semiconductor chip. First, after a semiconductor chip is mounted on a chip-mounting portion formed on a lead frame (die bonding at S201), pads formed on the semiconductor chip are connected to inner leads by wires (wire bonding at S202). Thereafter, the chip-mounting portion, the semiconductor chip, the wires, and the inner leads are sealed by resin (mold at S203). Then, after a dam formed on the lead frame is cut (dam cutting at 5204), plating films are formed on surfaces of portions of the outer leads being projected from the resin (plating at S205). Subsequently, after a mark is formed onto a surface of the resin (marking at 5206), the portions of the outer leads being projected from the resin are molded (lead molding at S207). After the semiconductor device SA2 is manufactured in this manner, electric characteristic inspection is performed thereto (testing at S208), and the semiconductor device SA2 which is determined as a good product is shipped as a product.

<Problems which has been Found by the Inventors>

As described above, in the semiconductor device formed in the BGA package or the QFP package, for example, the semiconductor chip and the wiring members are electrically connected by metal wires. Therefore, first, an existing connection structure between a semiconductor chip and metal wires will be described with reference to the drawings, and the problem involved in the existing connection structure will be then described.

Figure 9:
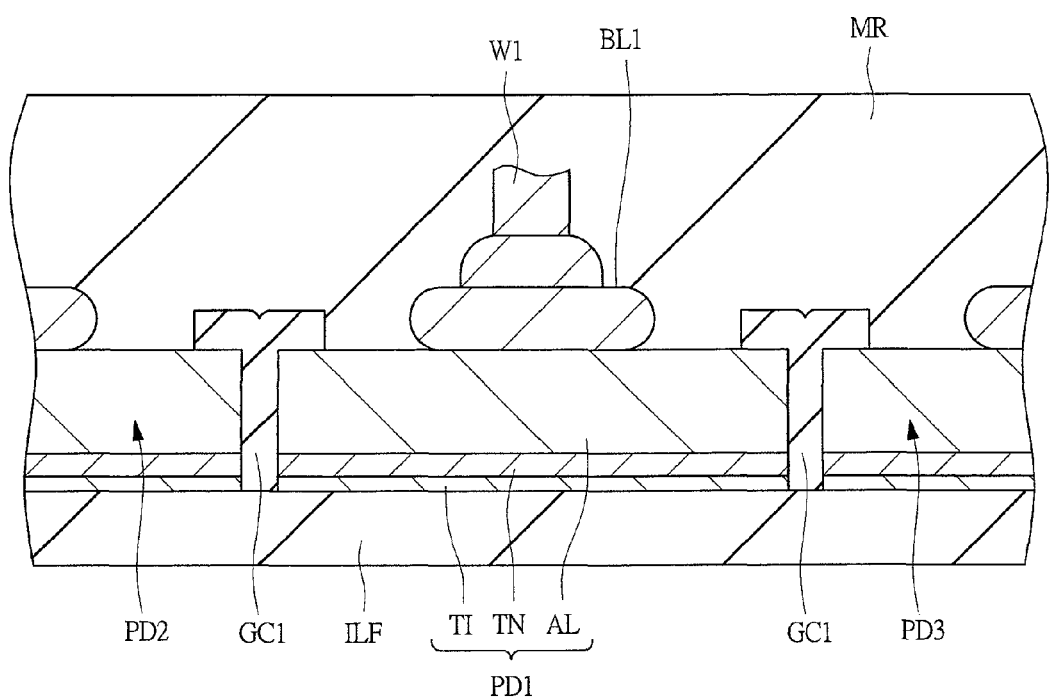
FIG. 9 is a cross-sectional view illustrating an existing connection structure of a pad and a wire.

FIG. 9 is a cross-sectional view illustrating an existing connection structure. As illustrated in FIG. 9, a plurality of pads PD1 to PD3 are arranged on an interlayer insulating film ILF. The pads PD1 to PD3 are each formed of, for example, a stacked film of a titanium film TI, a titanium nitride film TN formed on the titanium film TI, and an aluminum film AL formed on the titanium nitride film TN. Gap portions are provided among the pads PD1 to PD3, and a glass coat GC1 is filled in the gap portions in an embedding manner. A width of each gap portion is, for example, 2 μm. The glass coat GC1 is formed of, for example, a silicon oxide film or a silicon nitride film. The glass coat GC1 has a function of electrically insulating the plurality of pad PD1 to PD3 from one another, and is formed so as to coat outer edge portions of the pads PD1 to PD3 from the gap portions provided among the pads PD1 to PD3. Here, in the present specification, for example, the formed region of the glass coat GC1 coating the outer edge portions of the pads PD1 to PD3 is called a "coating amount of the glass coat GC1", and a width extending over a region coated with the glass coat GC1 from the end portions of the pads PD1 to PD3 is called a "coating width". In this case, for example, in the existing connection structure illustrated in FIG. 9, the coating width is, for example, 5 μm. Further, wires W1 are electrically connected on the plurality of pads PD1 to PD3 via balls BL1. The ball BL1 and the wire W1 are made of, for example, gold (Au). A sealing body made of, for example, resin MR is formed so as to cover the plurality of pads PD1 to PD3, the glass coat GC1, the balls BL1, and the wires W1.

Figure 10:
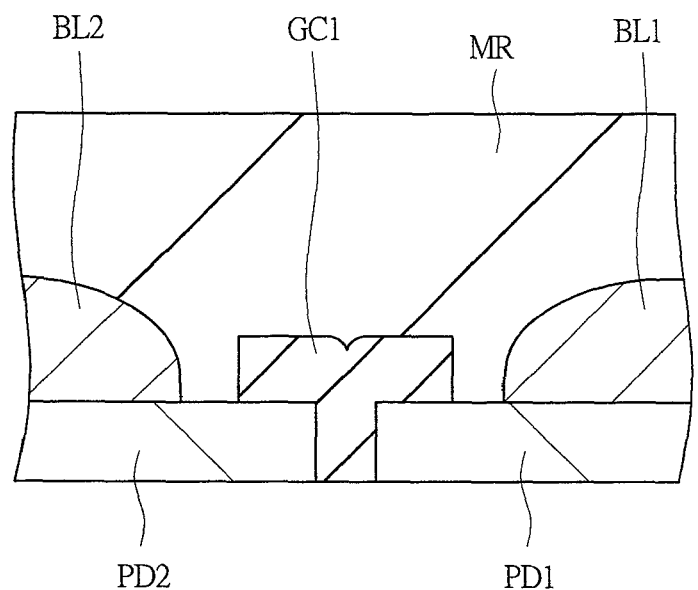
FIG. 10 is a partially-enlarged cross-sectional view of the existing connection structure illustrated in FIG. 9.

Next, the problems of the existing connection structure thus configured will be described. FIG. 10 is a partially-enlarged view of the existing connection structure illustrated in FIG. 9. As illustrated in FIG. 10, it is understood that a gap portion is provided between the pad PD1 and the pad PD2, and the glass coat GC1 is filled in the gap portion. The glass coat GC1 coats the outer edge portions of the pad PD1 and the pad PD2. Further, a ball BL1 made of gold is mounted on the pad PD1, while a ball BL2 made of gold is mounted on the pad PD2. Further, a sealing body (resin RM) is formed so as to cover the pad PD1 on which the ball BL1 is mounted, the pad PD2 on which the ball BL2 is mounted, and the glass coat GC1.

Figure 11:
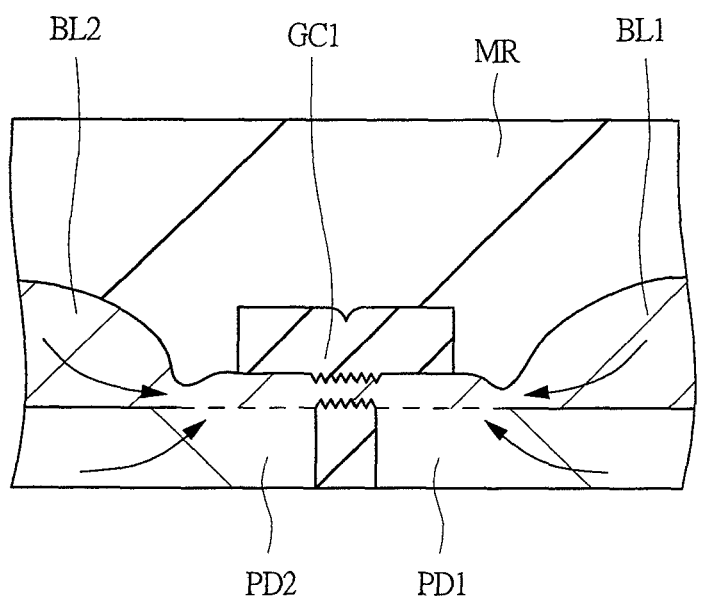
FIG. 11 is a diagram illustrating a short-circuit defect.

In the semiconductor device configured in this manner, the temperature of the semiconductor device rises due to heat generation during operation of the semiconductor chip, but the problems shown below become apparent according to rising of the temperature of the semiconductor device in the existing connection structure described above. That is, in the current connection structure, when the temperature of the semiconductor device rises, for example, the gold forming the ball BL1 tends to diffuse into the aluminum forming the pad PD1 easily and thus an alloy layer of the gold forming the ball BL1 and the aluminum forming the pad PD1 is formed in the pad PD1. When the temperature of the semiconductor device is retained at a high temperature, as illustrated in FIG. 11, the alloy layer grows to break through the glass coat GC1 provided for insulating the pad PD1 and the pad PD2 from each other so that the alloy layers grown from the pad PD1 and the pad PD2 adjacent to each other come in contact with each other. In this case, the pad PD1 and the pad PD2 adjacent to each other are electrically connected to each other, which results in short-circuit defect. Especially, in recent years, the high functionality and size reduction of the semiconductor device are promoted, and a distance between the pad PD1 and the pad PD2 adjacent to each other is made small according to the promotion, which results in such a situation that short-circuit defect easily occurs. That is, there is the situation where short-circuit defect easily occurs due to joint result of the operation guarantee at a high temperature and narrowing of a pitch between pads. For example, a semiconductor device used in an automobile product is frequently required to provide an operation guarantee at a temperature higher than an operation guarantee temperature of a general-use semiconductor device because a large amount of current may be caused to flow in the semiconductor device used in an automobile product in a short period of time and the semiconductor device used in an automobile product is frequently disposed around an engine room which reaches a high temperature. In this case, as described above, the gold forming the ball BL1 tends to diffuse into the aluminum forming the pad PD1 easily, so that breaking of the glass coat GC1 is caused by growth of the alloy layer of the gold and the aluminum, which results in easy apparentness of short-circuit defect between the pad PD1 and the pad PD2 adjacent to each other.

Regarding such a problem, for example, a solution described below is considered. First, as a first solution, it is considered to make a ball diameter of the ball BL1 formed on the pad PD1 small. In this case, it is thought that, since the distance between the ball BL1 and the ball BL2 adjacent to each other becomes large, the short-circuit defect due to the growth of the alloy layer can be reduced. However, even if the ball diameter of the ball BL1 is made small, gold diffuses from the ball BL1 toward the ball BL2. As a result, due to the diffusion of gold, voids are apt to easily occur in the ball BL1 having its diameter reduced. When the voids occur in the ball BL1 in this manner, electric connection between the pad PD1 and the wire is broken eventually.

Subsequently, as a second solution, it is considered to make the film thickness of the aluminum film forming the pad PD1 small. In this case, it is thought that, since the absolute amount of the aluminum is reduced, even if the gold diffuses in the pad PD1, growth of the alloy layer slows down, which can result in a reduction of short-circuit defect due to the growth of the alloy layer. However, when the film thickness of the aluminum film forming the pad PD1 is made small, an electric capacitance of the pad PD1 is reduced, so that a current which can be caused to flow in the pad PD1 is suppressed. Especially, it is required to cause a large amount of current to flow in a short period of time in a semiconductor device used in an automobile product and thus the lowering of the electric capacitance of the pad PD1 is problematic. Further, when the film thickness of the aluminum film forming the pad PD1 is made small, the ball BL1 is apt to be peeled off from the thinned pad PD1 easily due to tensile force upon looping of a wire or the number of times of probe contact at electric characteristic inspection time is apt to be restricted.

Further, as a third solution, it is considered to make the size of the pad PD1 or a pitch between pads large. In this case, it is thought that, for example, since the distance between the ball BL1 and the ball BL2 can be made large, the short-circuit defect due to growth of the alloy layer can be reduced. However, when the size of the pad PD1 or the pitch between pads is made large, since the number of pads to be formed on a semiconductor chip is determined for each product, when the determined number of pads are formed on the semiconductor chip, the size itself (plane area) of the semiconductor chip becomes large and thus the semiconductor device cannot be reduced in size and a manufacturing cost of the semiconductor device is also increased.

From the above explained reasons, it is understood that the above-described first to third solutions pose large adverse effects as the solutions of the short-circuit defect between pads due to growth of the alloy layer and they are not sufficiently effective. Therefore, in the first embodiment of the present invention, based upon the following assumptions to the specifications of the existing connection structure, an idea for suppressing the short-circuit defect between pads due to the growth of the alloy layer is adopted. Here, the above-described assumptions first involve that the pad size and the pitch between pads are not changed as compared with the existing connection structure. Thereby, enlargement of the size of the semiconductor chip can be suppressed so that such adverse effects as size enlargement of the semiconductor device and increase of the manufacturing cost of the semiconductor device can be avoided. Second, the assumptions involve that a size (an area) of an opening portion (a pad surface exposed from the glass coat) of the pad is not changed as compared with the existing connection structure. Thereby, a diameter reduction of a ball formed on the opening portion of the pad can be suppressed so that such an adverse effect as lowering of connection reliability between a pad and a wire can be avoided. Thus, in the first embodiment, the means for solving the short-circuit defect between pads due to the growth of the alloy layer is provided under the above-described assumptions. The technical idea in the first embodiment to which this idea is applied will be described below with reference to the drawings.

<Features in the First Embodiment>

Figure 12:
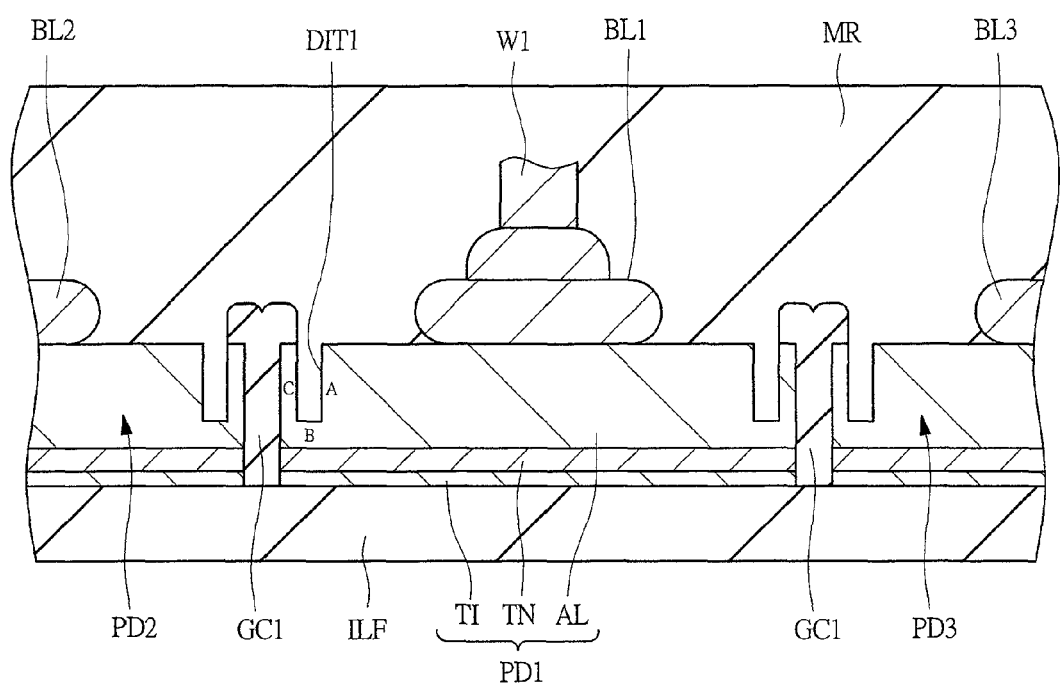
FIG. 12 is a cross-sectional view illustrating a connection structure between a pad and a metal wire according to the first embodiment of the present invention.

FIG. 12 is a cross-sectional view illustrating a connection structure between a semiconductor chip and a metal wire in the first embodiment. In FIG. 12, for example, a plurality of pads PD1 to PD3 are arranged on an interlayer insulating film ILF made of a silicon oxide film side by side. The pads PD1 to PD3 are each formed of a titanium film TI formed on the interlayer insulating film ILF, a titanium nitride film TN formed on the titanium film TI, and an aluminum film AL formed on the titanium nitride film TN. For example, a wire W1 made of gold is electrically connected to the pad PD via, for example, a ball BL1 made of gold. The aluminum film AL forming the pad PD1 may be made of not only pure aluminum but also aluminum alloy, and gold forming the ball BL1 and the wire W1 may be made of pure gold but also a gold alloy.

Gap portions are provided among the plurality of pads PD1 to PD3, and a glass coat GC1 composed of, for example, a silicon oxide film or a silicon nitride film is embedded in the gap portions. The glass coat GC1 is provided for securing electric insulation among the pads PD1 to PD3, and it coats outer edge portions of the pads PD1 to PD3. Trenches DIT1 are formed so as to be positioned adjacent to regions, coated with the glass coat GC1, of the outer edge portions of the pads PD1 to PD3. In other words, the glass coat GC1 coats a surface of the pad PD1 sandwiched between the end portion of the pad PD1 and the trench DIT1. Thus, a feature of the first embodiment lies in such a point that the trench DIT1 is formed so as to be positioned adjacent to the coating region coated with the glass coat GC1. In other words, the feature of the first embodiment lies in that the trench DIT1 is formed on a portion of the surface of the pad PD1 sandwiched between the ball BL1 and the pad PD2 in a plan view. Thereby, short-circuit defect between the pad PD1 and the pad PD2 adjacent to each other due to breaking of the glass coat GC1 caused by growth of the alloy layer can be suppressed.

The reasons will be described below. First, when the temperature of the semiconductor device rises, for example, gold forming the ball BL1 is apt to diffuse into aluminum forming the pad PD1 easily, so that an alloy layer of the gold forming the ball BL1 and the aluminum forming the pad PD1 is formed on the pad PD1. At this time, gold diffuses from the ball BL1 into, for example, a region A of the pad PD1. However, in the first embodiment, the trench DIT1 is formed and the film thickness of a region B is small. Therefore, diffusion of gold from the region A to the region B is suppressed, so that diffusion of gold from the region B to a region C is suppressed. The region C of the pad PD1 is in contact with the glass coat GC1, but since an amount of gold diffusing into the region C is suppressed, the alloy layer formed in the region C is reduced. As a result, breaking of the glass coat GC1 due to growth of the alloy layer in the region C coated with the glass coat GC1 can be suppressed, so that short-circuit defect between the pad PD1 and the pad PD2 caused by breaking of the glass coat GC1 can be suppressed. That is, in the first embodiment, according to a first mechanism for reducing diffusion routes of gold diffusing from the region A to the region C via the region B, which is obtained by forming the trench DIT1 on the outer edge portion of the pad PD1, formation of the alloy layer in the region C can be suppressed. In the first embodiment, since growth of the alloy layer in the region C can be suppressed, breaking of the glass coat GC1 due to growth of the alloy layer can be suppressed, so that the short-circuit defect between the pad PD1 and the pad PD2 generated due to breaking of the glass coat GC1 can be suppressed.

Further, in the first embodiment, for example, even if an alloy layer is formed in the region A due to diffusion of gold from the ball BL1 from the pad PD1, since the trench DIT1 is formed between the region A and the region C, reaching of the alloy layer formed in the region A at the region C can be suppressed. That is, in the first embodiment, according to a second mechanism where the trench DIT1 blocks growth of the alloy layer from the region A to the region C, formation of the alloy layer in the region C can be suppressed. In the first embodiment, since growth of the alloy layer in the region C can be suppressed, breaking of the glass coat GC1 due to growth of the alloy layer can be suppressed, so that the short-circuit defect between the pad PD1 and the pad PD2 generated due to breaking of the glass coat GC1 can be suppressed.

Further, in the first embodiment, according to the above-descried second mechanism, growth of the alloy layer from the region A to the region C is suppressed, but such a fact means that formation of the alloy layer is harder in a region near the pad PD2 than in the region A of the pad PD1 where the alloy layer is formed. That is, in the first embodiment, the distance between the region of the pad PD1 where the alloy layer is formed and the pad PD2 adjacent to the pad PD1 can be made large, and from this viewpoint, the short-circuit defect between the pad PD1 and the pad PD2 can be also suppressed.

Here, the connection structure (see FIG. 12) in the first embodiment has a pad size and a pitch between pads equal to those of the existing connection structure (see FIG. 9). For example, in the first embodiment, the width of the gap portion formed between pads is set to 2 μm. Thereby, according to the first embodiment, enlargement of the size of the semiconductor chip can be suppressed, so that such an adverse effect as size enlargement of the semiconductor device can be avoided. In the first embodiment, the size (area) of the opening portion (the pad surface exposed from the glass coat GC1) of the pad is not changed from the existing connection structure. Thereby, the diameter reduction of the ball BL1 formed on the opening portion of the pad PD1 can be suppressed, so that such an adverse effect as lowering of the connection reliability between the pad PD1 and the wire W1 can be avoided.

For example, in the first embodiment, a feature lies in that the trench DIT1 is formed in the outer edge portion of the pad PD1. However, it is thought that, if the coating width of the glass coat GC1 coating the outer edge portion of the pad PD1 is set to be equal to that in the existing connection structure, the opening portion of the pad PD1 is narrowed by a size corresponding to the width of the trench DIT1 provided adjacent to the glass coat GC1. The narrowing of the opening portion leads to diameter reduction of the ball BL1 formed on the opening portion of the pad PD1, so that a possibility of occurrence of such an adverse effect as lowering of the connection reliability between the pad PD1 and the wire W1 increases.

In the first embodiment, therefore, the coating width of the glass coat GC1 is made smaller than that in the existing connection structure. That is, in the first embodiment, such a configuration is adopted that the total length of the coating width of the glass coat GC1 and the width of the trench DIT1 is equal to the coating width of the glass coat GC1 in the existing connection structure. Specifically, for example, if it is assumed that the coating width of the glass coat GC1 in the existing connection structure is 5 μm, the coating width of the glass coat GC1 in the first embodiment is, for example, 2.5 μm and the width of the trench DIT1 is also 2.5 μm. Thereby, the connection structure in the first embodiment can be such that the size of the opening portion of the pad PD1 can be set to be equal to that in the existing connection structure. As a result, the diameter reduction of the ball BL1 formed on the opening portion of the pad PD1 can be suppressed, so that such an adverse effect as lowering of the connection reliability between the pad PD1 and the wire W1 can be avoided.

Further, in the connection structure in the first embodiment, by setting the size of the opening portion of the pad PD1 to be equal to that in the existing connection structure, an effect shown below will be obtained. That is, since the size of the opening portion of the pad PD1 is equal to that of the existing connection structure even in the connection structure of the first embodiment 1 where the trench DIT1 is provided in the outer edge portion of the pad PD1, a margin absorbing positional deviation which may occur when the ball BL1 is mounted on the pad PD1 can be sufficiently secured. Such a fact means that a possibility that the ball BL1 is bonded on the glass coat GC1, for example, due to deviation of a mounting position of the ball BL1 can be reduced, so that a crack of the glass coat GC1 due to bonding of the ball BL1 on the glass coat GC1 can be suppressed.

Incidentally, in the first embodiment, such a configuration is adopted that both the coating width of the glass coat GC1 and the width of the trench DIT1 are the same 2.5 μm, but the present invention is not limited to the configuration. A configuration where the coating width of the glass coat GC1 and the width of the trench DIT1 are different from each other can be adopted. For example, such a configuration can be adopted that the coating width of the glass coat GC1 is set to, for example, 3 μm, while the width of the trench DIT1 is set to, for example, 2 μm. On the other hand, such a configuration can be adopted that the coating width of the glass coat GC1 is set to, for example, 2 μm, while the width of the trench DIT1 is set to, for example, 3 μm. At this time, when the width of the trench DIT1 is made large, the effect according to the above-described second mechanism can be sufficiently obtained. That is, since enlargement of the width of the trench DIT1 means that a function of blocking growth of the alloy layer from the region A to the region C is strengthened according to the enlargement, formation of the alloy layer in the region C is sufficiently suppressed. Therefore, when the width of the trench DIT1 is made large, since growth of the alloy layer in the region C can be sufficiently suppressed, breaking of the glass coat GC1 due to the growth of the alloy layer can be suppressed, so that short-circuit defect between the pad PD1 and the pad PD2 caused due to breaking of the glass coat GC1 can be suppressed. On the other hand, when the coating width of the glass coat GC1 is made large, the merits described below can be obtained. For example, the ball BL1 is mounted on the pad PD1, and tensile force then acts on the pad PD1 at a step of drawing out a wire W1. In this case, it is thought that the pad PD1 is peeled off by the above-described tensile force. However, when the coating width of the glass coat GC1 is made large, a function of resisting the tension is increased, peeling-off of the pad PD1 can be suppressed.

Further, in the first embodiment, the depth of the trench DIT1 is set to, for example, 0.3 μm to 0.4 μm. At this time, it is preferable that the depth of the trench DIT1 is deeper in view of such a point that the effect according to the first mechanism is sufficiently exerted by reducing the film thickness of the aluminum film AL existing in the region B positioned under the trench DIT1. This is because the film thickness of the aluminum film AL in the region B becomes smaller according to increase of the depth of the trench DIT1 so that a diffusion route of gold from the region A to the region C through the region B can be narrowed sufficiently. Further, it is also useful to adopt a structure where the bottom portion of the trench DIT1 reaches the titanium nitride film TN. In this case, this is because, since the aluminum film AL does not exist in the region B, the diffusion route of gold from the region A to the region C via the aluminum film AL is blocked. On the other hand, it is preferable that the depth of the trench DIT1 is shallower in view of preventing the pad PD1 from being peeled off. This is because when the depth of the trench DIT1 is made excessively deep, the film thickness of the pad PD1 in the region B becomes thin, so that, for example, when tensile force acts on the pad PD1 like the step of drawing out the wire W1 (looping step), force is concentrically applied to the region B to break the same, so that a possibility that the pad PD1 is peeled off increases.

Next, as illustrated in FIG. 12, a sealing body made of resin MR is formed so as to cover the plurality of pads PD1 to PD3, the glass coat GC1 provided among the plurality of pads PD1 to PD3, and the wire W1 disposed via the ball BL1. At this time, a portion of the sealing body (resin MR) is filled in the trench DIT1 formed in the pad PD1. That is, the inside of the trench DIT1 is filled with the resin. At this time, since the sealing body (resin MR) and the pad PD1 are in contact with each other, when an alloy layer is formed on a surface of the pad PD1, it is thought that peeling-off between the pad PD1 and the sealing body (resin MR) due to volume expansion caused by the growth of the alloy layer becomes an issue, but such an issue does not take place usually. This is because the growth of the alloy layer formed on the pad PD1 becomes significant in a high temperature state of, for example, 150° C. In such a high temperature state, since the temperature of the resin MR forming the sealing body exceeds a glass-transition temperature, the resin MR becomes soft. From this, even if the volume expansion occurs due to formation of the alloy layer on the surface of the pad PD1, the resin which has become soft deforms so as to absorb the volume expansion, so that lowering of adhesiveness between the pad PD1 and the sealing body (resin MR) does not become an issue. On the other hand, the glass coat GC1 is formed of a silicon oxide film or a silicon nitride film which is relatively hard and is breakable. Therefore, for example, when the alloy layer which has grown from the pad PD1 reaches an interface with the glass coat GC1, the volume expansion due to the growth of the alloy layer cannot be absorbed by the glass coat GC1 which is hard and breakable and the glass coat GC1 itself breaks, so that the issue about the short-circuit defect between the pad PD1 and the pad PD2 caused by the growth of the alloy layer becomes apparent.

Regarding this point, in the first embodiment, the trench DIT1 is formed so as to be positioned adjacent to the coating region of the pad PD1 coated with the glass coat GC1. In other words, the trench DIT1 is formed on a portion of the surface of the pad PD1 sandwiched between the ball BL1 and the pad PD2. According to the first mechanism and the second mechanism obtained by forming the trench DIT1, the short-circuit defect between the pad PD1 and the pad PD2 caused by the growth of the alloy layer can be suppressed.

<Planar Layout Configuration 1>

Figure 13:
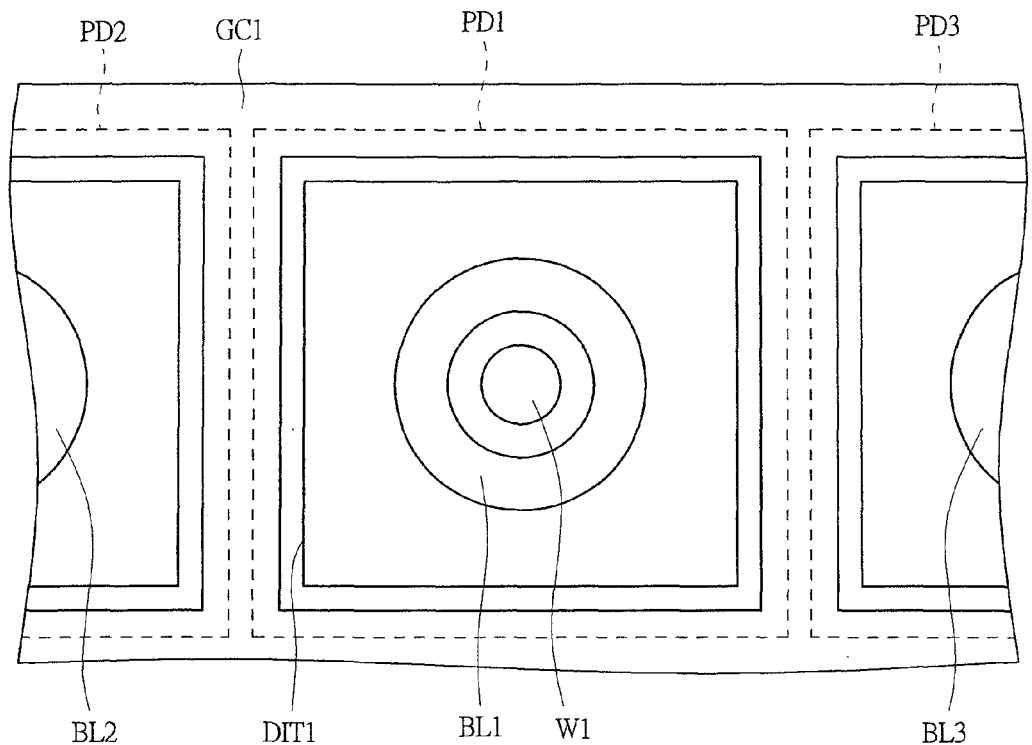
FIG. 13 is a diagram illustrating one example of a planar layout of the connection structure according to the first embodiment.

Next, a feature configuration regarding a planar layout of the connection structure in the first embodiment will be described. FIG. 13 is a diagram illustrating one example of a planar layout of the connection structure in the first embodiment. As illustrated in FIG. 13, rectangular pads PD1 to PD3 are arranged side by side in a lateral direction. For example, an outer shape of the pad PD1 is formed in a rectangular shape, and the pad PD1 has a first side closest to the pad PD2 and second sides intersecting with the first side. At this time, the whole outer edge portion of the pad PD1 is coated with the glass coat GC1. Specifically, an outer shape periphery of the pad PD1 is illustrated by a broken line, from which it is understood that the whole outer edge portion of the pad PD1 is coated with the glass coat GC1. That is, in FIG. 13, the glass coat GC1 is formed so as to coat the whole outer edge portion of the pad PD1, and the coating widths of the glass coat GC1 coating four sides of the pad PD1, respectively, are equal to one another. As illustrated in FIG. 13, the trench DIT1 is formed on an inner region of the coating region, which has been coated with the glass coat GC1, of the region of the pad PD1. That is, in the example of the planar layout illustrated in FIG. 13, the trench DIT1 is formed along the whole outer edge portion of the pad PD1. The inside of the trench DIT1 formed in the surrounding manner is an opening portion of the pad PD1, the ball BL1 is mounted in a central region of the opening portion, and the wire W1 is connected to the ball BL1. Therefore, it is understood that the trench DIT1 is formed on the surface of the pad PD1 so as to surround the ball BL1.

Similarly, the pad PD2 and the pad PD3 arranged so as to be positioned adjacent to the pad PD1 have configurations similar to that of the pad PD1. For example, the whole outer edge portion of the pad PD2 is coated with the glass coat GC1 and the trench is formed over an inner region adjacent to the coating region coated with the glass coat GC1. The ball BL2 is mounted on the opening portion of the pad PD2 surrounded by the trench, and the wire is electrically connected on the ball BL2. Therefore, according to the connection structure in the first embodiment illustrated in FIG. 13, it can be said that the trench is formed in a portion of the surface of the pad PD2 sandwiched between the ball BL2 and the pad PD1 in a plan view. Similarly, the whole outer edge portion of the pad PD3 is coated with the glass coat GC1, and the trench is formed over an inner region adjacent to the coating region coated with the glass coat GC1. Then, the ball BL3 is mounted on the opening portion of the pad PD3 surrounded by the trench and the wire is electrically connected on the ball BL3. Therefore, according to the connection structure in the first embodiment illustrated in FIG. 13, it can be said that the trench is formed in a portion of the surface of the pad PD3 sandwiched between the ball BL3 and the pad PD1 in a plan view.

According to the connection structure in the first embodiment thus configured, for example, when the semiconductor device is retained in a high temperature state, gold diffuses from the ball BL1 mounted on the pad PD1 to the aluminum film constituting the pad PD1. As a result, an alloy layer grows on the pad PD1 from the ball BL1 concentrically. However, according to the first embodiment illustrated in FIG. 13, since the trench DIT1 is formed in the inner region of the coated region coated with the glass coat GC1, growth of the alloy layer with such a degree that the alloy layer breaks through the glass coat GC1 can be suppressed according to the above-described first mechanism and second mechanism. Similarly, growths of the alloy layer growing from the ball BL2 of the pad PD2 concentrically and of the alloy layer growing from the ball BL3 of the pad PD3 concentrically are also suppressed by the trenches provided in the pad PD2 and the pad PD3, respectively. From this, according to the first embodiment, short-circuit defect between the pad PD1 and the pad PD2 and short-circuit defect between the pad PD1 and the pad PD3 caused by the growths of the alloy layers can be effectively suppressed. Especially, in the planar layout illustrated in FIG. 13, for example, since the trench DIT1 is formed over the inner region of the whole coating region of the pad PD1, an effect where breaking of the glass coat GC1 due to the growth of the alloy layer can be prevented in the whole coating region coating the outer edge portion of the pad PD1 can be obtained.

<Planar Layout Configuration 2>

Figure 14:
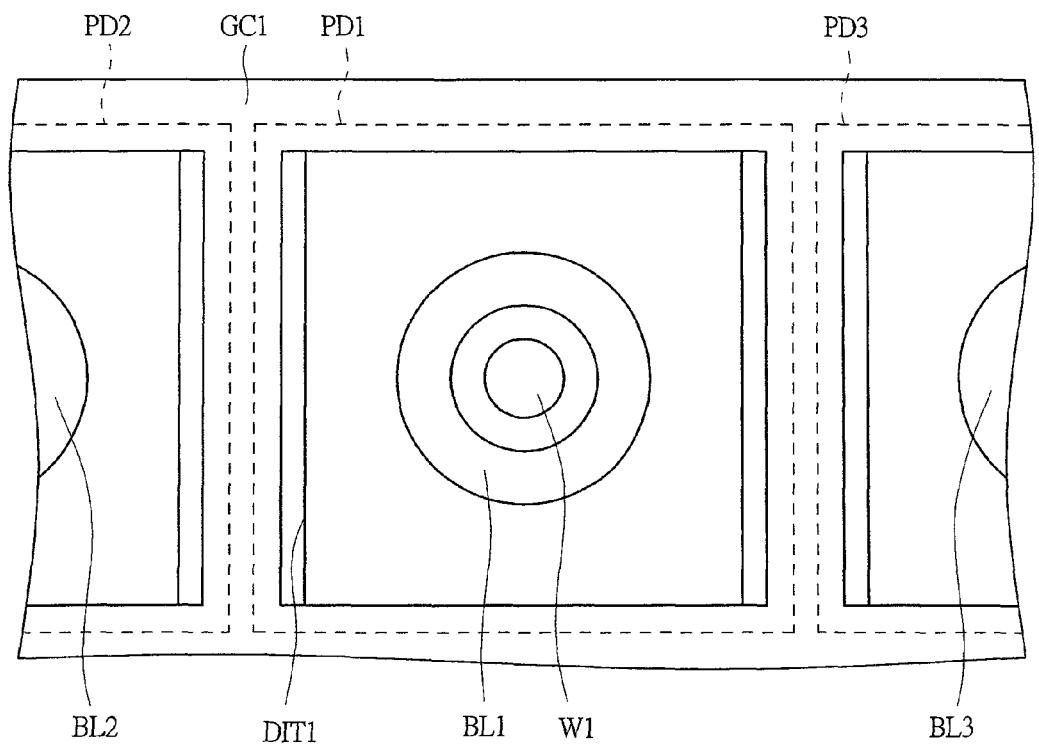
FIG. 14 is a diagram illustrating one example of another planar layout of the connection structure according to the first embodiment.

Subsequently, a feature configuration regarding another planar layout of the connection structure in the first embodiment will be described. FIG. 14 is a diagram illustrating one example of another planar layout of the connection structure in the first embodiment. Since the planar layout illustrated in FIG. 14 has a structure substantially similar to that of the planar layout illustrated in FIG. 13, different points between the planar layouts will be mainly described. A feature of the planar layout illustrated in FIG. 14 lies in such a point that, for example, when the pad PD1 is focused, it is not that the trench DIT1 is formed along the whole coating region of the pad PD1 but that the trenches DIT1 are formed only in portions of the inner region of the coating region parallel with some of the sides of the pad PD1. Specifically, as illustrated in FIG. 14, the trenches DIT1 are formed only along the side closest to the pad PD2 and the side closest to the pad PD3 of the four sides defining the outer shape of the pad PD1. Even in this case, short-circuit defect between the pad PD1 and the pad PD2 and short-circuit defect between the pad PD1 and the pad PD3 caused by the growth of the alloy layer can be effectively suppressed.

This is because the short-circuit defect caused by the growth of the alloy layer become apparent, for example, between the pad PD1 and the pad PD2 adjacent to each other, and between the pad PD1 and the pad PD3 adjacent to each other. That is, the alloy layer grows from the ball BL1 mounted on the pad PD1 concentrically, but the alloy layer grown toward the pad PD2 of the alloy layer thus grown causes the short-circuit defect between the pad PD1 and the pad PD2. That is, since it is only required that the growth of the alloy layer toward the pad PD2 can be suppressed, it is only required that the growth of a portion of the alloy layer positioned at the side closest to the pad PD2 of the four sides of the pad PD1 can be suppressed. From this viewpoint, the growth of the alloy layer toward the pad PD2 is suppressed by providing the trench DIT1 in a portion of the inner region of the coating region positioned closest to the pad PD2. Similarly, for example, the alloy layer growing toward the pad PD3 causes the short-circuit defect between the pad PD1 and the pad PD3. That is, since it is only required that growth of the alloy layer toward the pad PD3 can be suppressed, it is only required that the growth of a portion of the alloy layer positioned at the side closest to the pad PD3 of the four sides of the pad PD1 can be suppressed. From this viewpoint, the growth of the alloy layer toward the pad PD3 is suppressed by providing the trench DIT1 in a portion of the inner region of the coating region positioned closest to the pad PD3.

On the other hand, the trench DIT1 is not provided on the upper side and the lower side of the pad PD1 illustrated in FIG. 14. Since the alloy layer grows from the ball BL1 concentrically, the alloy layer grows toward the upper side and the lower side of the pad PD1 illustrated in FIG. 14, but since no pad adjacent to the pad PD1 exists on the upper side and the lower side of the pad PD1, even if the alloy grows from the pad PD1 upward or downward, short-circuit defect hardly occurs. Thus, in the planar layout illustrated in FIG. 14, the trenches DIT1 are formed only along the side of the pad PD1 closest to the pad PD2 and the side thereof closest to the pad PD3. Even in this case, from the above-described reason, short-circuit defect between the pad PD1 and the pad PD2 and short-circuit defect between the pad PD1 and the pad PD3 caused by the growth of the alloy layer can be effectively suppressed.

<Planar Layout Configuration 3>

Figure 15:
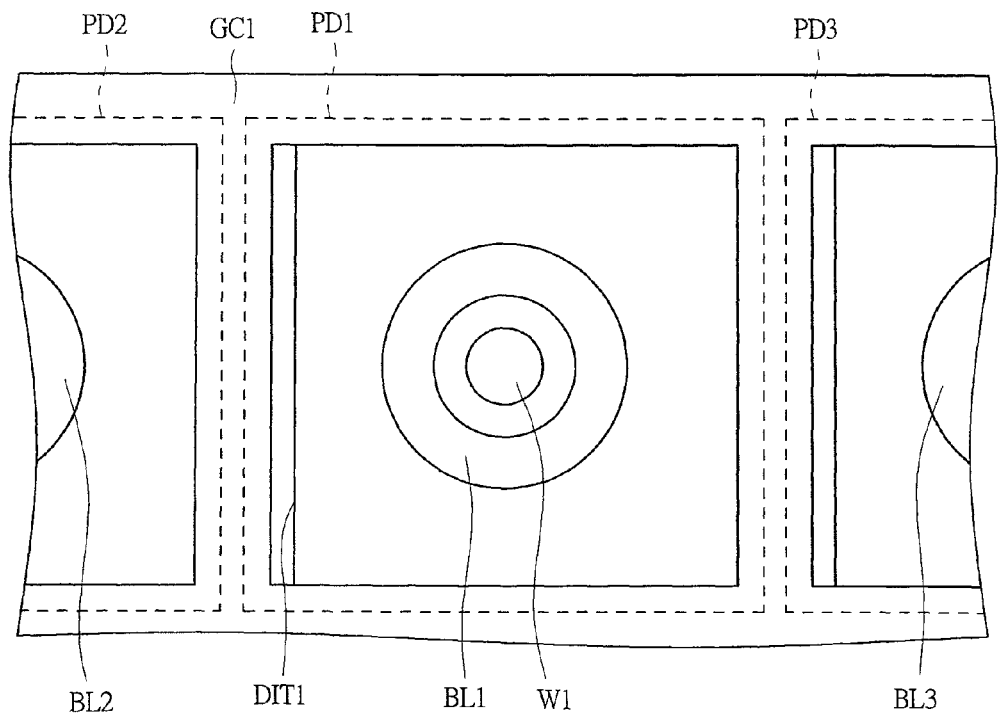
FIG. 15 is a diagram illustrating one example of another planar layout of the connection structure according to the first embodiment.

Next, a feature configuration regarding another planar layout of the connection structure in the first embodiment will be described. FIG. 15 is a diagram illustrating one example of another planar layout of the connection structure according to the first embodiment. Since the planar layout illustrated in FIG. 15 has a structure substantially similar to that of the planar layout illustrated in FIG. 14, different points between the planar layouts will be mainly described. A feature of the planar layout in FIG. 15 lies in such a point that, for example, when the pad PD1 is focused, it is not that the trench DIT1 is formed along the whole coating region of the pad PD1 but that the trench DIT1 is formed only in the inner region of the coating region parallel with one side of the sides of the pad PD1. Specifically, as illustrated in FIG. 15, the trench DIT1 is formed only along the side closest to the pad PD2 of the four sides defining the outer shape of the pad PD1. Similarly, when the pad PD3 is focused, as illustrated in FIG. 15, the trench is formed only along the side closest to the pad PD1 of the four sides defining the outer shape of the pad PD3. Even in this case, short-circuit defect between the pad PD1 and the pad PD2 and short-circuit defect between the pad PD1 and the pad PD3 caused by the growth of the alloy layer can be effectively suppressed.

For example, from a viewpoint of suppression of short-circuit defect between the pad PD1 and the pad PD2, for example, as illustrated in FIG. 14, it is preferable that the trench DIT1 is formed along the side of the pad PD1 closest to the pad PD2 and the trench DIT1 is formed along the side of the pad PD2 closest to the pad PD1. This is because growth of the alloy layer from the ball BL1 mounted on the pad PD1 toward the pad PD2 can be suppressed by the trench DIT1 provided on the pad PD1 and growth of the alloy layer from the ball BL2 mounted on the pad PD2 toward the pad PD1 can be suppressed by the trench provided on the pad PD2. That is, in the planar layout illustrated in FIG. 14, both the growth of the alloy layer from the ball BL1 and the growth of the alloy layer from the ball BL2 can be suppressed, so that short-circuit defect caused by growth of the alloy layer between the pad PD1 and the pad PD2 can be effectively suppressed.

On the other hand, in the planar layout illustrated in FIG. 15, for example, when the pad PD1 is focused, the trench DIT1 is formed only along the side closest to the pad PD2 of four sides defining the outer shape of the pad PD1. Since the pad PD2 and the pad PD3 are configured in the same manner as the pad PD1, for example, as illustrated in FIG. 15, when the pad PD2 is focused, the trench is not formed along the side closest to the pad PD1 of the four sides defining the outer shape of the pad PD2. Therefore, the planar layout illustrated in FIG. 15 is smaller in effect of being capable of reducing short-circuit defect between the pad PD1 and the pad PD2 than the planar layout illustrated in FIG. 14, but even in this case, short-circuit defect between the pad PD1 and the pad PD2 can be efficiently reduced.

Specifically, as illustrated in FIG. 15, the growth of the alloy layer from the ball BL2 mounted on the pad PD2 toward the pad PD1 cannot be suppressed, but the growth of the alloy layer from the ball BL1 mounted on the pad PD1 toward the pad PD2 can be suppressed by the trench DIT1 provided in the pad PD1. From this, since growth of one of the alloy layer growing from the pad PD1 and the alloy layer growing from the pad PD2 can be suppressed, short-circuit defect between the pad PD1 and the pad PD2 can be reduced.

<Planar Layout Configuration 4>

Figure 16:
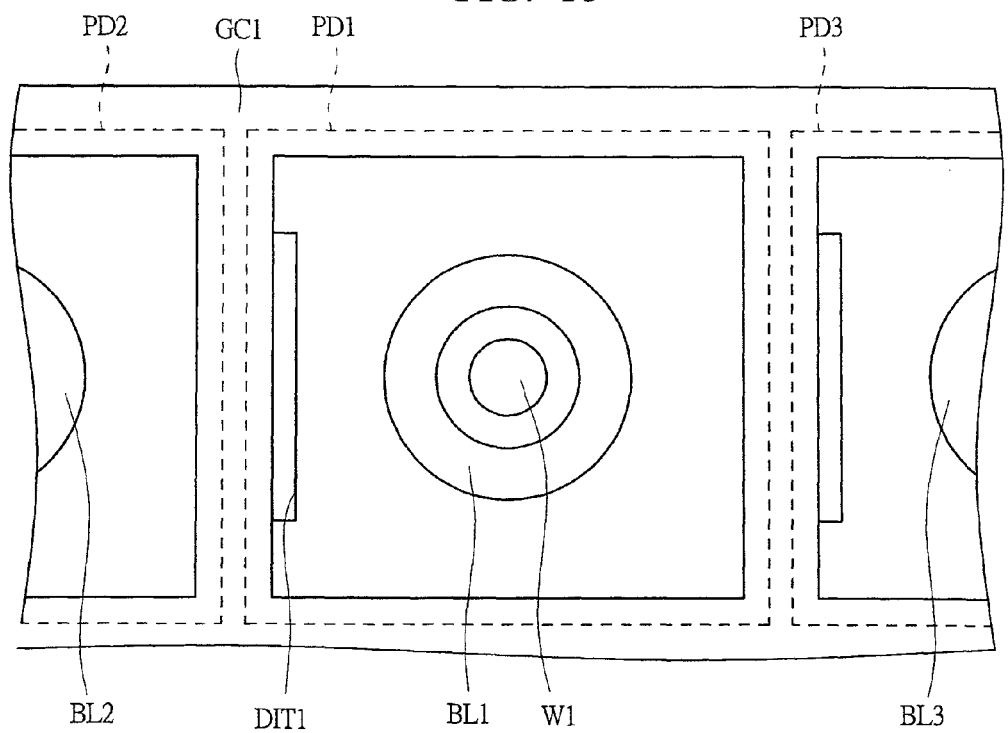
FIG. 16 is a diagram illustrating one example of another planar layout of the connection structure according to the first embodiment.

Next, a feature configuration regarding another planar layout of the connection structure according to the first embodiment will be described. FIG. 16 is a diagram illustrating one example of another planar layout of the connection structure according to the first embodiment. Since the planar layout illustrated in FIG. 16 has a structure substantially similar to that of the planar layout illustrated in FIG. 15, different points from both the planar layouts will be mainly described. The feature of the planar layout in FIG. 16 lies in such a point that, for example, when the pad PD1 is focused, it is not that the trench DIT1 is formed along the whole coating region of the pad PD1 but that the trenches DIT1 are formed only in a partial region of the inner region of the coating region parallel with one side of the sides of the pad PD1. Specifically, as illustrated in FIG. 16, the trench DIT1 is extended along the side closest to the pad PD2 of the four sides defining the outer shape of the pad PD1 and it is formed only on a portion of the side closest to the pad PD2. Even in this case, short-circuit defect between the pad PD1 and the pad PD2 and short-circuit defect between the pad PD1 and the pad PD3 caused by the growth of the alloy layer can be suppressed.

For example, when the pad PD1 is focused, the alloy layer grows from the ball BL1 mounted on the pad PD1 concentrically. In this case, considering the side of the pad PD1 closest to the pad PD2, since a distance between the vicinity of a central portion of the closest side in its longitudinal direction and the ball BL1 is shortest, it is thought that the alloy layer reaches the vicinity of the central portion of the side at the earliest time. On the other hand, since the distance between the vicinity of a corner portion of the side and the ball BL1 is not shortest, it is thought that it is difficult for the alloy layer to reach the vicinity of the corner portion earlier than the vicinity of the central portion. Therefore, it is understood that there is a high possibility that breaking of the glass coat GC1 due to the growth of the alloy layer and the short-circuit defect between the pad PD1 and the pad PD2 caused by the growth of the alloy layer via the breaking of the glass coat GC1 occur in the vicinity of the central portion of the side closest to the pad PD2. In view of these circumstances, in the planar layout illustrated in FIG. 16, the trench DIT1 is provided so as to be adjacent to only the vicinity of the central portion of the side closest to the pad PD2 where short-circuiting is likely to occur. In this case, since the trench DIT1 is provided in the vicinity of the central portion of the side which the alloy layer is most likely to reach from the ball BL1, the short-circuit defect between the pad PD1 and the pad PD2 and the short-circuit defect between the pad PD1 and the pad PD3 caused by the growth of the alloy layer can be effectively suppressed.

Incidentally, for example, when the pad PD1 in FIG. 16 is focused, it can be thought that the vicinity of the central portion of the side closest to the pad PD2 indicates a region having a length substantially equal to a ball diameter of the ball BL1 from the center of this side.

<Planar Layout Configuration 5>

Figure 17:
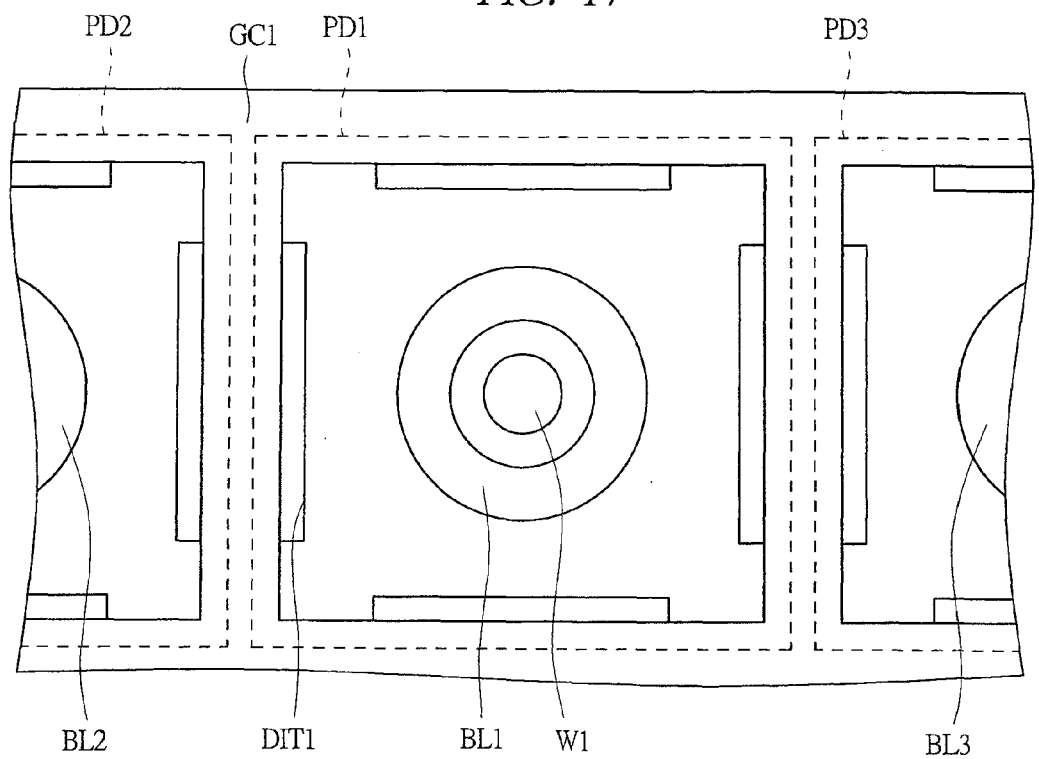
FIG. 17 is a diagram illustrating one example of another planar layout of the connection structure according to the first embodiment.

Subsequently, a feature configuration regarding another planar layout of the connection structure according to the first embodiment will be described. FIG. 17 is a diagram illustrating one example of another planar layout of the connection structure according to the first embodiment. Since the planar layout illustrated in FIG. 17 has a structure substantially similar to that of the planar layout illustrated in FIG. 16, different points between the planar layouts will be mainly described. A feature of the planar layout in FIG. 17 lies in such a point that, for example, when the pad PD1 is focused, trenches DIT1 are formed in partial regions of the inner region of the coating region positioned in parallel to respective sides of four sides of the pad PD1. Specifically, as illustrated in FIG. 17, the trenches DIT1 are formed in the partial regions of the respective sides of the four sides defining the outer shape of the pad PD1. Even in this case, the short-circuit defect between the pad PD1 and the pad PD2 and the short-circuit defect between the pad PD1 and the pad PD3 caused by the growth of the alloy layer can be suppressed. That is, according to the planar layout illustrated in FIG. 17, the trenches DIT1 are provided so as to be adjacent to the vicinity of the central portion of the side closest to the pad PD2 prone to be a short-circuiting portion, while the trench DIT1 is provided so as to be adjacent to the vicinity of the central portion of the side closest to the pad PD3 prone to be a short-circuiting portion. In the planer layout illustrated in FIG. 17, since the trenches DIT1 are provided so as to be adjacent to the vicinities of the central portions of the sides which the alloy layer is most likely to reach from the ball BL1 in this manner, the short-circuit defect between the pad PD1 and the pad PD2 and the short-circuit defect between the pad PD1 and the pad PD3 caused by the growth of the alloy layer can be effectively suppressed.

Further, in the planar layout illustrated in FIG. 17, since trenches DIT1 are also formed so as to be adjacent to the vicinities of central portions of two sides existing in an upper side and a lower side of the pad PD1, breaking (peeling-off) of the glass coat GC1 due to the growth of the alloy layer in these directions can also be suppressed. That is, in two sides existing in the upper side and the lower side of the pad PD1, no pad adjacent to either of the two sides exists, so that a possibility about occurrence of the short-circuit defect is low. However, since breaking of the coating glass coat GC1 can be an entry source of a foreign matter, such a configuration that the trenches DIT1 are formed so as to be adjacent to the vicinities of the central portions of the two sides existing in the upper and lower sides of the pad PD1 is useful.

<Planar Layout Configuration 6>

Figure 18:
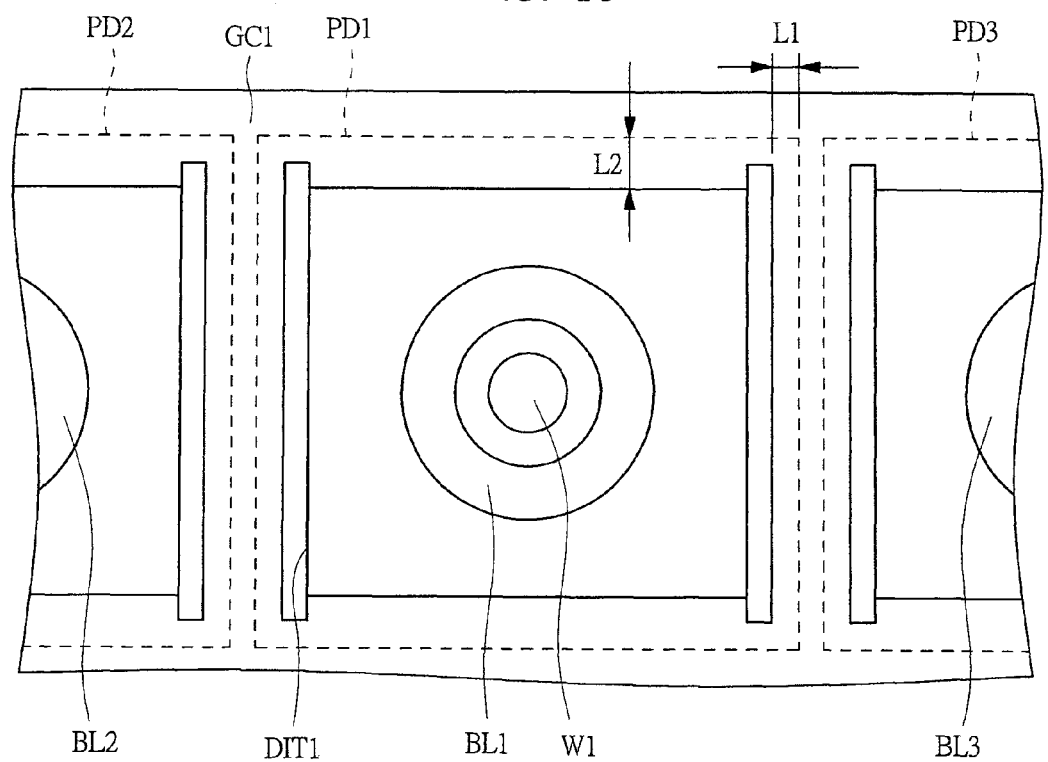
FIG. 18 is a diagram illustrating one example of another planar layout of the connection structure according to the first embodiment.

Next, a feature configuration regarding another planar layout of the connection structure according to the first embodiment will be described. FIG. 18 is a diagram illustrating one example of another planar layout of the connection structure according to the first embodiment. Since the planar layout illustrated in FIG. 18 has a structure substantially similar to that of the planar layout illustrated in FIG. 14, different points between the planar layouts will be mainly described. A feature of the planar layout in FIG. 18 lies in such a point that, for example, when the pad PD1 is focused, it is not that the trench DIT1 is formed along the whole coating region of the pad PD1 but that the trenches DIT1 are formed only in an inner region of the coating region parallel to some of the sides of the pad PD1 and the coating width of the glass coat GC1 coating a side on which the trench DIT1 is not formed is large. Specifically, as illustrated in FIG. 18, a trench DIT1 is formed along the side, which is closest to the pad PD2, of four sides defining the outer shape of the pad PD1 and a trench DIT1 is formed along the side closest to the pad PD3. Even in this case, the short-circuit defect between the pad PD1 and the pad PD2 and the short-circuit defect between the pad PD1 and the pad PD3 caused by the growth of the alloy layer can be suppressed in the same manner as the planar layout illustrated in FIG. 14.

Further, the feature of the planar layout illustrated in FIG. 18 lies in that a coating width L2 of the glass coat GC1 coating sides intersecting with the side closest to the pad PD2 and the side closest to the pad PD3 are larger than a coating width L1 of the glass coat GC1 coating the side closest to the pad PD2 and the side closest to the pad PD3. Thereby, since a coating amount of the glass coat GC1 coating the pad PD1 is large, for example, when a tensile force acts on the pad PD1 like in a step of drawing out the wire W1 (looping step), a possibility that the pad PD1 is peeled off can be lowered, so that reliability improvement of the semiconductor device can be achieved.

In particular, in the planar layout illustrated in FIG. 18, the coating width L2 (for example, 5 μm) is set to be equal to a total length of the coating width L1 (for example, 2.5 μm) and the width of the trench DIT1 (for example, 2.5 μm). Therefore, in the planar layout illustrated in FIG. 18, the size (area) of the opening portion (the pad surface exposed from the glass coat GC1) of the pad is not changed as compared with that of the existing connection structure. Thereby, the diameter reduction of the ball BL1 formed on the opening portion of the pad PD1 can be suppressed, so that such an adverse effect that connection reliability between the pad PD1 and the wire W1 lowers can be avoided. Further, according to the planar layout illustrated in FIG. 18, since the size of the opening portion of the pad PD1 is equal to that of the existing connection structure even in such a structure that the trenches DIT1 are provided on the outer edge portion of the pad PD1, a margin absorbing deviation of a mounting position of the ball BL1 on the pad PD1 can be sufficiently secured. This means, for example, reduction of a possibility that the ball BL1 is bonded on the glass coat GC1 due to deviation of the mounting position of the ball BL1, so that cracking of the glass coat GC1 due to the bonding of the ball BL1 on the glass coat GC1 can be suppressed.

Further, according to the planar layout illustrated in FIG. 18, such a configuration is adopted that the coating width L2 of the glass coat GC1 coating the sides intersecting with the side closest to the pad PD2 or the side closest to the pad PD3 is made large, and, according to this configuration, a possibility that the pad PD1 is peeled off when a tensile force acts on the pad PD1 can be lowered. Therefore, the depth of the trench DIT1 formed along the side closest to the pad PD2 or the side closest to the pad PD3 can be increased. That is, when the depth of the trench DIT1 is increased, for example, the film thickness of the pad PD1 in the region B illustrated in FIG. 12 is made smaller, and when a tensile force acts on the pad PD1, for example, like the step of drawing out the wire W1 (looping step), a possibility that force intensely acts on the region B to break the same, which results in peeling-off of the pad PD1, increases. According to the planar layout illustrated in FIG. 18, however, even if the depth of the trench DIT1 is increased, the coating width L2 of the glass coat GC1 coating the side intersecting with the side closest to the pad PD2 or the side closest to the pad PD3 is configured to be large, so that even if tensile force acts on the pad PD1, peeling-off of the pad PD1 can be sufficiently suppressed. From this fact, according to the planar layout illustrated in FIG. 18, the film thickness of the aluminum film AL in the region B illustrated in FIG. 12 can be made small by increasing the depth of the trench DIT1 formed along the side closest to the pad PD2 or the side closest to the pad PD3. As a result, since the diffusion route of gold diffusing from the region A to the region C through the region B in FIG. 12 can be sufficiently narrowed, growth of the alloy layer can be suppressed, so that short-circuit defect caused by breaking of the glass coat GC1 can be sufficiently suppressed. In particular, in the planar layout illustrated in FIG. 18, it is also useful to adopt such a structure that the bottom portion of the trench DIT1 reaches the titanium nitride film TN. This is because, since the aluminum film AL in the region B illustrated in FIG. 12 does not exist, the diffusion route of gold from the region A to the region C via the aluminum film AL is blocked. Thus, it is understood that the planar layout illustrated in FIG. 18 is a useful layout which can suppress the short-circuit defect between pads effectively and can also suppress peeling-off of the pad sufficiently.

<Manufacturing Method of the Semiconductor Device According to the First Embodiment>

The semiconductor device according to the first embodiment is configured in the above-described manner and a manufacturing method of the semiconductor device will be described hereinafter.

First, a semiconductor wafer formed in a substantially disk shape in a plan view is prepared. Then, semiconductor elements are formed on the semiconductor wafer. A step of forming the semiconductor elements can be performed using a manufacturing technique such as a film-forming technique, an etching technique, a thermal processing technique, an ion-implanting technique, a photolithography technique, or the like. For example, the semiconductor elements can involve a MOSFET (Metal Oxide Field Effect Transistor) or a bipolar transistor being formed on a silicon substrate. Further, the semiconductor elements can also involve a passive element such as one represented by a resistance element, a capacitance element, or an inductor element.

Subsequently, a wiring layer is formed on the semiconductor wafer on which the semiconductor elements have been formed. The wiring layer is formed by patterning a metal film being formed on an interlayer insulating film. As the wiring layer, a multi-layer wiring structure is frequently adopted, but a wiring layer composed of a single layer may be adopted. A wire included in the wiring layer is formed of, for example, a wire using an aluminum film or a wire using a copper film (damascene wire).

Figure 19:
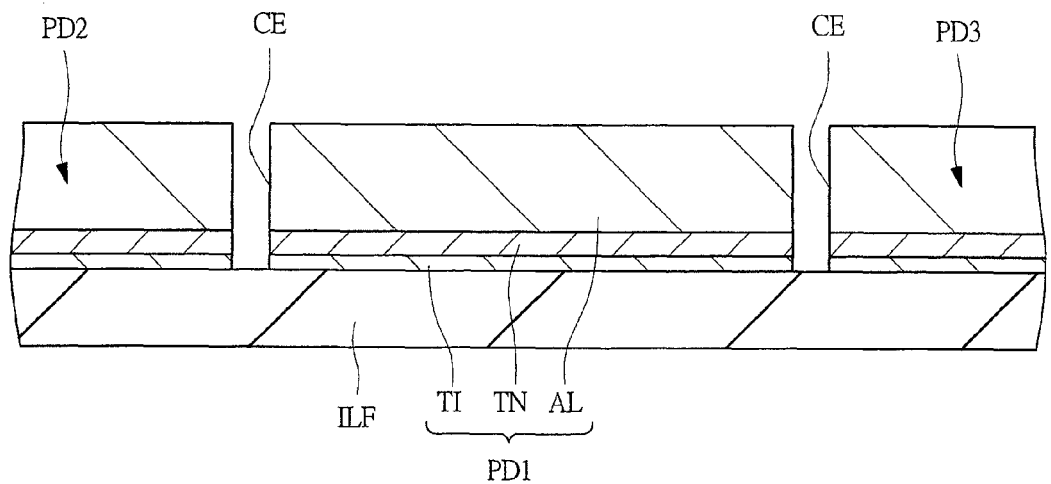
FIG. 19 is a cross-sectional view illustrating a step of a manufacturing process of a semiconductor device according to the first embodiment.

Thereafter, as illustrated in FIG. 19, pads PD1 to PD3 are formed to an uppermost layer of the multi-layer wiring structure. Specifically, for example, a titanium film TI is formed on an interlayer insulating film ILF formed of a silicon oxide film, and a titanium nitride film TN is formed on the titanium film TI. Further, an aluminum film AL is formed on the titanium nitride film TN. A stacked film obtained by stacking the titanium film TI, the titanium nitride film TN, and the aluminum film AL on the interlayer insulating film ILF sequentially can be formed in this manner. At this time, the titanium film TI, the titanium nitride film TN, and the aluminum film AL can be formed by using, for example, a sputtering method.

Next, the stacked film composed of the titanium film TI, the titanium nitride film TN, and the aluminum film AL is patterned by using the photolithography technique and the etching technique. Thereby, a plurality of pads PD1 to PD3 can be formed. The pads PD1 to PD3 are arranged with gap portions CE.

Figure 20:
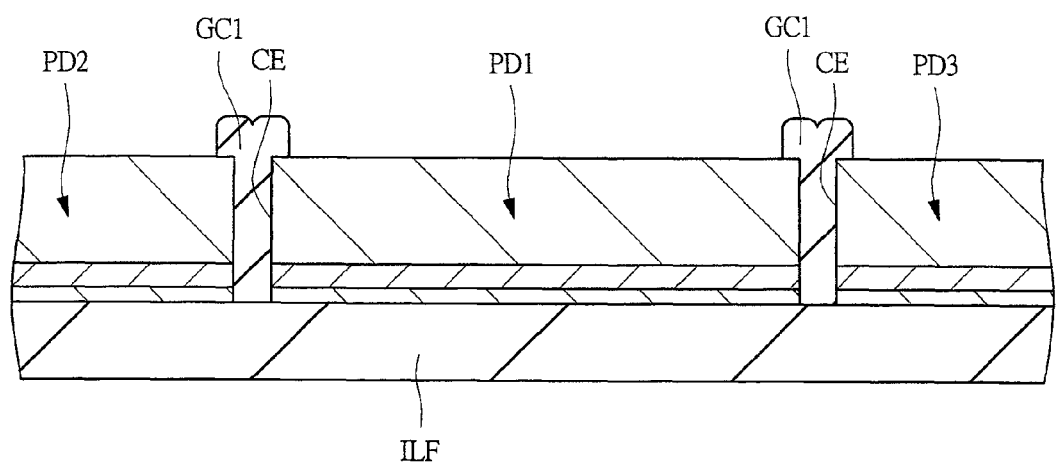
FIG. 20 is a cross-sectional view illustrating a step of the manufacturing process of a semiconductor device following the step illustrated in FIG. 19.

Subsequently, as illustrated in FIG. 20, an insulating film composed of, for example, a silicon oxide film or a silicon nitride film is formed on the pads PD1 to PD3 including insides of the gap portions CE. At this time, the insulating film is also embedded in the insides of the gap portions CE. By using the photolithography technique and the etching technique, the insulating film is patterned. Thereby, the glass coat GC1 composed of the insulating film can be formed. The glass coat GC1 is embedded into the gap portions CE formed among the pads PD1 to PD3 and is formed so as to coat outer edge portions of the pads PD1 to PD3.

Figure 21:
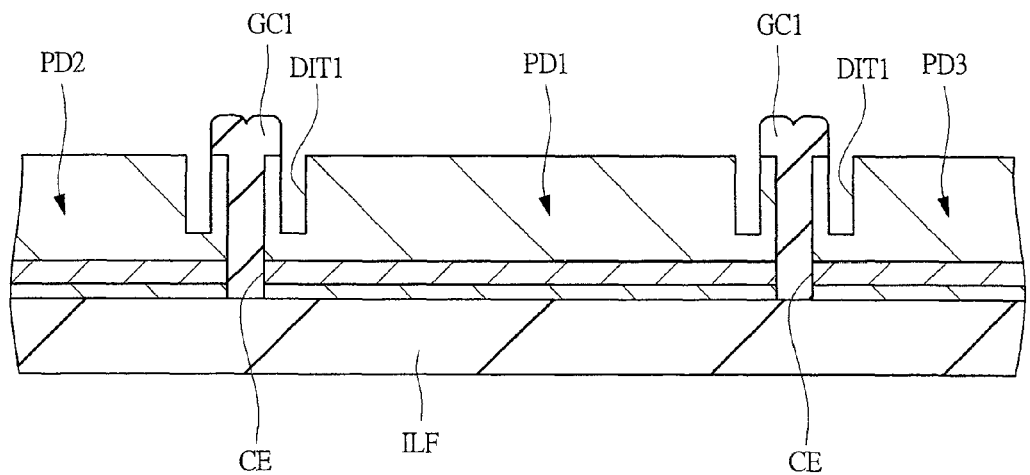
FIG. 21 is a cross-sectional view illustrating a step of the manufacturing process of a semiconductor device following the step illustrated in FIG. 20.

Next, as illustrated in FIG. 21, trenches DIT1 are formed in the pad PD1 to PD3 by using the photolithography technique and the etching technique. The trenches DIT1 are provided so as to be adjacent to respective coating regions of the pads PD1 to PD3 coated with the glass coat GC1. A semiconductor wafer subjected to a front-end process can be obtained in the above-described manner.

After the thickness of the semiconductor wafer is reduced by performing a back grinding processing on the semiconductor wafer, a plurality of semiconductor chips are obtained by dicing the semiconductor wafer. Thereafter, when the BGA package is manufactured, a semiconductor device (BGA package) is completed through the steps illustrated in the flowchart in FIG. 5. On the other hand, when the QFP package is manufactured, a semiconductor device (QFP package) is completed through the steps illustrated in the flowchart in FIG. 8. The semiconductor device of the first embodiment can be manufactured in the above-described manner.

Second Embodiment

<Features in Second Embodiment>

Figure 22:
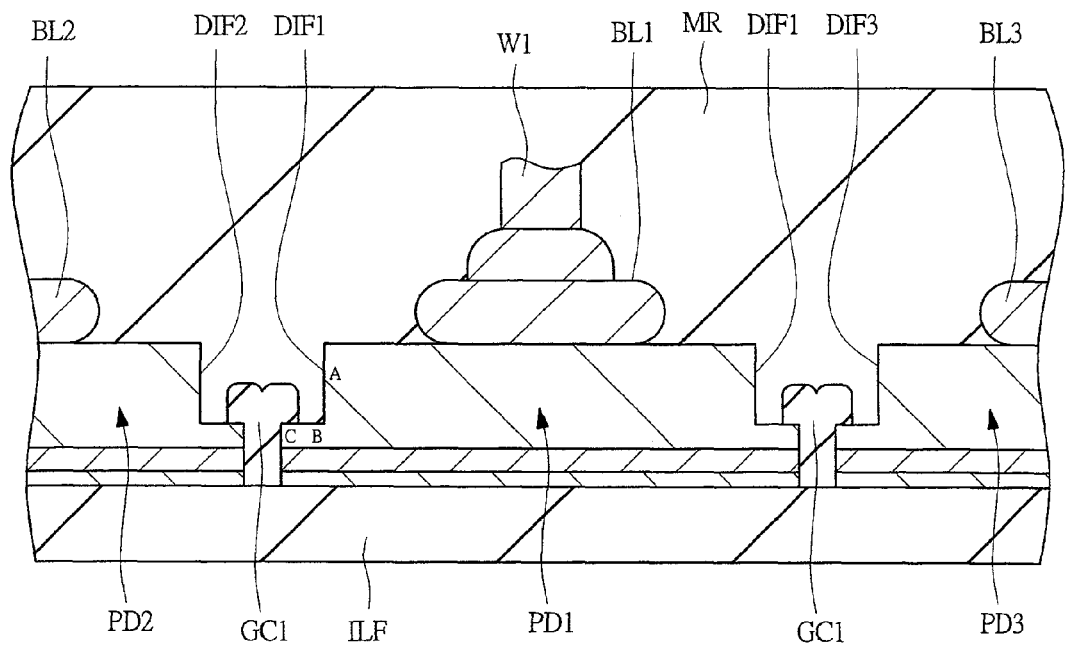
FIG. 22 is a cross-sectional view illustrating a connection structure between a pad and a metal wire according to a second embodiment.

FIG. 22 is a cross-sectional view illustrating a connection structure between a pad and a wire according to a second embodiment. Since the connection structure according to the second embodiment illustrated in FIG. 22 is substantially similar to the connection structure in the first embodiment illustrated in FIG. 12, different points between the embodiments will be mainly described. In FIG. 22, step portions DIF1 are formed on end portions of a pad PD1 in the second embodiment. Similarly, step portions DIF2 are also formed on end portions of a pad PD2, and step portions DIF3 are also formed on end portions of a pad PD3. A trench is formed by the step portion DIF1 and the step portion DIF2, and a gap portion is formed on a bottom portion of the trench. At this time, a glass coat GC1 is formed so as to be embedded into the inside of the gap portion between the pad PD1 and the pad PD2 and extend on the bottom portion of the trench. That is, the glass coat GC1 is formed on the bottom portion of the trench.

In the connection structure according to the second embodiment thus configured, the thicknesses of a region B and a region C are thinner than that of a region A. Therefore, since the thickness of the region B is small even in the second embodiment like the first embodiment, diffusion of gold from the region A to the region B is suppressed, so that diffusion of gold from the region B to the region C is suppressed. That is, in the second embodiment, by forming the step portion DIF1 on the outer edge portion of the pad PD1, the formation of the alloy layer in the region C can be suppressed according to a first mechanism of reducing the diffusion route of gold diffusing from the region A to the region C through the region B. As a result, in the second embodiment, since growth of the alloy layer in the region C can be suppressed, breaking of the glass coat GC1 due to the growth of the alloy layer can be suppressed, so that short-circuit defect between the pad PD1 and the pad PD2 generated due to breaking of the glass coat GC1 can be suppressed.

Further, even in the second embodiment, for example, even if the alloy layer is formed in the region A due to diffusion of gold from the ball BL1 to the pad PD1, since the step portion DIF1 is formed between the region A and the region C, reaching of the alloy layer formed in the region A at the region C can be suppressed. That is, even in the second embodiment, formation of the alloy layer in the region C can be suppressed according to a second mechanism where the step portion DIF1 blocks growth of the alloy layer from the region A to the region C.

Further, even in the second embodiment, although growth of the alloy layer from the region A to the region C is suppressed according to the above-described second mechanism and such a fact means that formation of the alloy layer becomes more difficult in the region closer to the pad PD2 than in the region A of the pad PD1 on which the alloy layer is formed. That is, even in the second embodiment, the distance between the region of the pad PD1 on which the alloy layer is formed and the pad PD2 positioned adjacent to the pad PD1 can be made large according to the above-described second mechanism. From this viewpoint, short-circuit defect between the pad PD1 and the pad PD2 can also be reduced.

Further, as a feature specific to the second embodiment, such a point that the thickness of the region C which is the coating region of the glass coat GC1 becomes smaller than that of the region A is involved. For example, even if gold which has diffused from the ball BL1 diffuses from the region A to the region C through the region B, an absolute amount of the aluminum existing in the region C is reduced. Therefore, even if the alloy layer is formed in the region C, since the absolute amount of the alloy layer can be reduced, a volume expansion due to the alloy layer can be suppressed to a small amount, so that breaking of the glass coat GC1 and short-circuit defect between the pad PD1 and the pad PD2 based upon breaking of the glass coat GC1 can be reduced.

<Manufacturing Method of the Semiconductor device according to the Second Embodiment>

The semiconductor device in the second embodiment is configured in the above manner, and a manufacturing method thereof will be described below.

Figure 23:
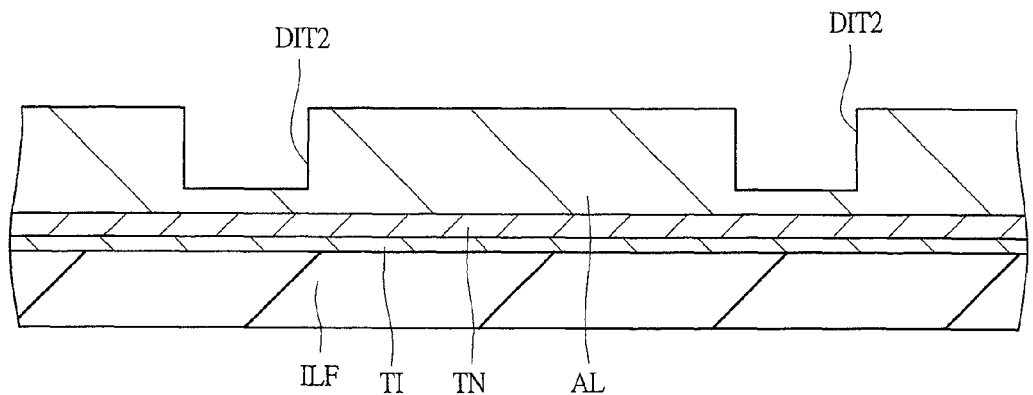
FIG. 23 is a cross-sectional view illustrating a step of a manufacturing process of a semiconductor device according to the second embodiment.

First, as illustrated in FIG. 23, pads PD1 to PD3 are formed on an uppermost layer of a multilayered wiring structure. Specifically, for example, a titanium film TI is formed on an interlayer insulating film ILF composed of a silicon oxide film, and a titanium nitride film TN is formed on the titanium film TI. Further, an aluminum film AL is formed on the titanium nitride film TN. A stacked film obtained by stacking the titanium film TI, the titanium nitride film TN, and the aluminum film AL on the interlayer insulating film ILF sequentially can be formed in this manner. At this time, the titanium film TI, the titanium nitride film TN, and the aluminum film AL can be formed by using, for example, a sputtering method.

Figure 24:
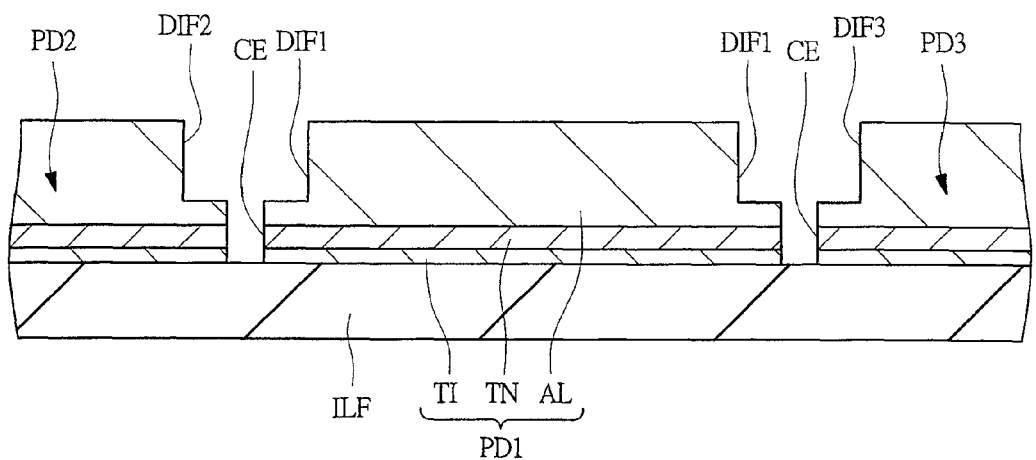
FIG. 24 is a cross-sectional view illustrating a step of the manufacturing process of a semiconductor device following the step illustrated in FIG. 23.

Next, the aluminum film AL is patterned by using the photolithography technique and the etching technique. In this manner, trenches DIT2 can be formed in the aluminum film AL. Thereafter, as illustrated in FIG. 24, the gap portions CE are formed in the trenches DIT2 by using the photolithography technique and the etching technique, so that a plurality of pad PD1 to PD3 being separated from one another via the gap portions CE can be formed. At this time, for example, step portions DIF1 are formed on end portions of the pad PD1 and step portions DIF2 are formed on end portions of the pad PD2.

Figure 25:
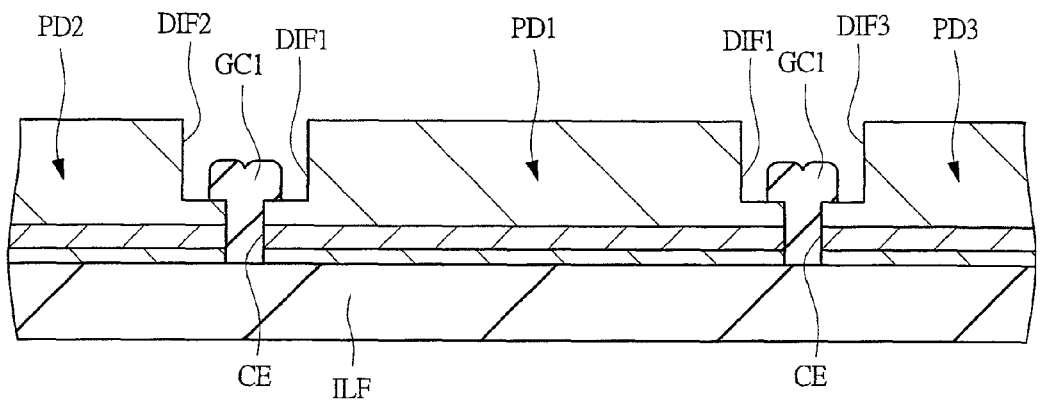
FIG. 25 is a cross-sectional view illustrating a step of the manufacturing process of a semiconductor device following the step illustrated in FIG. 24.

Subsequently, as illustrated in FIG. 25, an insulating film composed of, for example, a silicon oxide film or a silicon nitride film, is formed over upper surfaces of the pads PD1 to PD3 including the insides of the gap portions CE, the step portions DIF1 and the step portions DIF2. The insulating film is patterned by using the photolithography technique and the etching technique. Thereby, a glass coat GC1 which is embedded into the gap portions CE and coats portions of the step portions DIF1 and portions of the step portions DIF2 can be formed. Steps performed subsequent thereto are similar to those in the first embodiment. The semiconductor device according to the second embodiment can be manufactured in this manner.

Third Embodiment

<Feature in the Third Embodiment>

Figure 26:
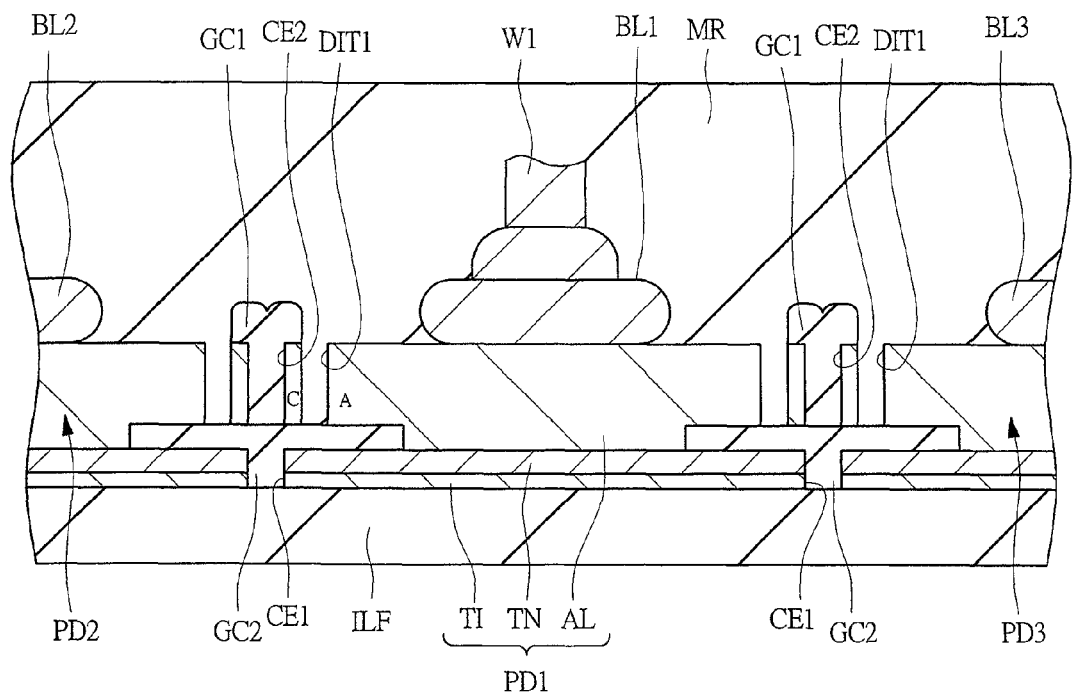
FIG. 26 is a cross-sectional view illustrating a connection structure between a pad and a metal wire according to a third embodiment.

FIG. 26 is a cross-sectional view illustrating a connection structure between a pad and a wire according to a third embodiment. Since the connection structure in the third embodiment illustrated in FIG. 26 has a configuration substantially similar to that in the first embodiment illustrated in FIG. 12, different points between the connection structures will be mainly described. In FIG. 26, a plurality of pads PD1 to PD3 are each formed of a stacked film composed of a titanium film TI, a titanium nitride film TN, and an aluminum film AL. Here, in the present specification, a combined film of the titanium film TI and the titanium nitride film TN is called "lower layer film", while the aluminum film AL is called "upper layer film". In this case, in FIG. 26, a gap portion CE1 is formed between the lower layer film of the pad PD1 and the lower layer film of the pad PD2, and a glass coat GC2 is formed on an upper surface of a portion of the lower layer film of the pad PD1 and on an upper surface of a portion of the lower layer film of the pad PD2 from the inside of the gap portion CE1. The glass coat GC2 is composed of an insulating film such as, for example, a silicon oxide film or a silicon nitride film. The upper layer film is formed over the lower layer film from an upper surface of the glass coat GC2. A gap portion CE2 is formed in the upper layer film formed on the glass coat GC2, and a glass coat GC1 is formed so as to be embedded in the inside of the gap portion CE2 and to coat an upper surface of a portion of the upper layer film. At this time, the gap portion CE1 and the gap portion CE2 are formed so as to overlap with each other in a plan view. Further, in the third embodiment, a trench DIT1 is formed so as to be adjacent to a coating region coated with the glass coat GC1. That is, the trench DIT1 is formed so as to be adjacent to the coating region of the upper layer film. The trench DIT1 is formed so as to extend through the aluminum film AL which is the upper layer film to expose the glass coat GC2 at a bottom portion.

Here, a feature point of the third embodiment lies in that the region A and the region C of the pad PD1 are separated from each other by the glass coat GC2. Therefore, for example, gold which is diffused from the ball BL1 to the region A is blocked by the glass coat GC2 to be prevented from diffusing in the region C. From this fact, gold can be prevented from diffusing into the aluminum film AL in the region C existing in the lower portion of the coating region of the glass coat GC1. As a result, formation of the alloy layer in the region C can be prevented, so that breaking of the glass coat GC1 coating the region C can be prevented. That is, in the third embodiment, diffusion of gold from the region A to the region C can be prevented by separating the region C existing in the lower portion of the coating region coated with the glass coat GC1 from the region A of the pad PD1 by the glass coat GC2. Thereby, according to the third embodiment, breaking of the glass coat GC1 and short-circuit defect between the pad PD1 and the pad PD2 based upon the breaking of the glass coat GC1 can be reduced.

Incidentally, even in the third embodiment, a distance between the region of the pad PD1 where the alloy layer is formed and the pad PD2 positioned adjacent to the pad PD1 can be made large, and short-circuit defect between the pad PD1 and the pad PD2 can also be suppressed from this viewpoint.

<Planar Layout Configuration 1>

Figure 27:
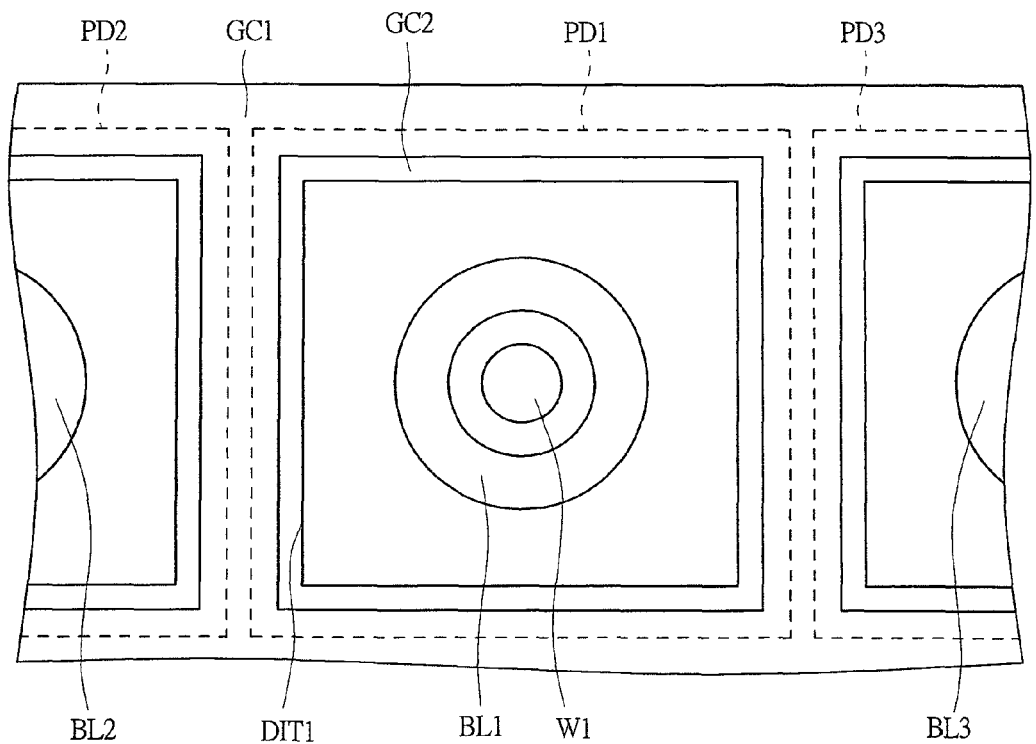
FIG. 27 is a diagram illustrating one example of a planar layout of the connection structure according to the third embodiment.

Next, a feature configuration regarding a planar layout of the connection structure in the third embodiment will be described. FIG. 27 is a diagram illustrating one example of a planar layout of the connection structure according to the third embodiment. As illustrated in FIG. 27, rectangular pads PD1 to PD3 are arranged side by side in a lateral direction. For example, the outer shape of the pad PD1 is formed in a rectangular shape, and it has a first side closest to the pad PD2 and second sides intersecting with the first side. At this time, a whole edge portion of the pad PD1 is coated with a glass coat GC1. Specifically, an outer shape periphery of the pad PD1 is illustrated by a broken line, from which, it is understood that the whole outer edge portion of the pad PD1 is coated with the glass coat GC1. That is, in FIG. 27, the glass coat GC1 is formed so as to coat the whole outer edge portion of the pad PD1, and coating widths of the glass coat GC1 coating respective four sides of the pad PD1 are equal to one another. As illustrated in FIG. 27, a trench DIT1 is formed in an inner region of a coating region, coated with the glass coat GC1, of the region of the pad PD1. That is, in the example of the planar layout illustrated in FIG. 27, the trench DIT1 is formed so as to extend along the whole outer edge portion of the pad PD1. The inside of the trench DIT1 formed in the surrounding manner is an opening portion, and a ball BL1 is placed on a central region of the opening portion, and a wire W1 is connected onto the ball BL1. Therefore, it is understood that the trench DIT1 is formed on a surface of the pad PD1 so as to surround the ball BL1. The glass coat GC2 is exposed at a bottom portion of the trench DIT1.

According to the connection structure according to the third embodiment thus configured, for example, when the semiconductor device is retained in a high-temperature state, gold diffuses from the ball BL1 mounted on the pad PD1 to the aluminum film constituting the pad PD1. As a result, an alloy layer grows on the pad PD1 from the ball BL1 concentrically. According to the third embodiment illustrated in FIG. 27, however, the trench DIT1 is formed in the inner region of the coating region coated with the glass coat GC1, and the coating region coated with the glass coat GC1 is separated from the inner region of the pad PD1 on which the ball BL1 is mounted by the glass coat GC2 exposed on the bottom portion of the trench DIT1. Therefore, diffusion of gold toward the lower portion of the coating region can be prevented and breaking of the glass coat GC1 forming the coating region due to growth of the alloy layer can be prevented effectively. From this, according to the third embodiment, short-circuit defect between the pad PD1 and the pad PD2 and short-circuit defect between the pad PD1 and the pad PD3 caused by the growth of the alloy layer can be effectively suppressed. In particular, in the planar layout illustrated in FIG. 27, for example, since the trench DIT1 and the glass coat GC2 are formed over in the inner region of the whole coating region of the pad PD1, such an effect that breaking of the glass coat GC1 caused by growth of the alloy layer can be prevented effectively over the whole coating region coating the outer edge portion of the pad PD1 can be obtained.

<Planar Layout Configuration 2>

Figure 28:
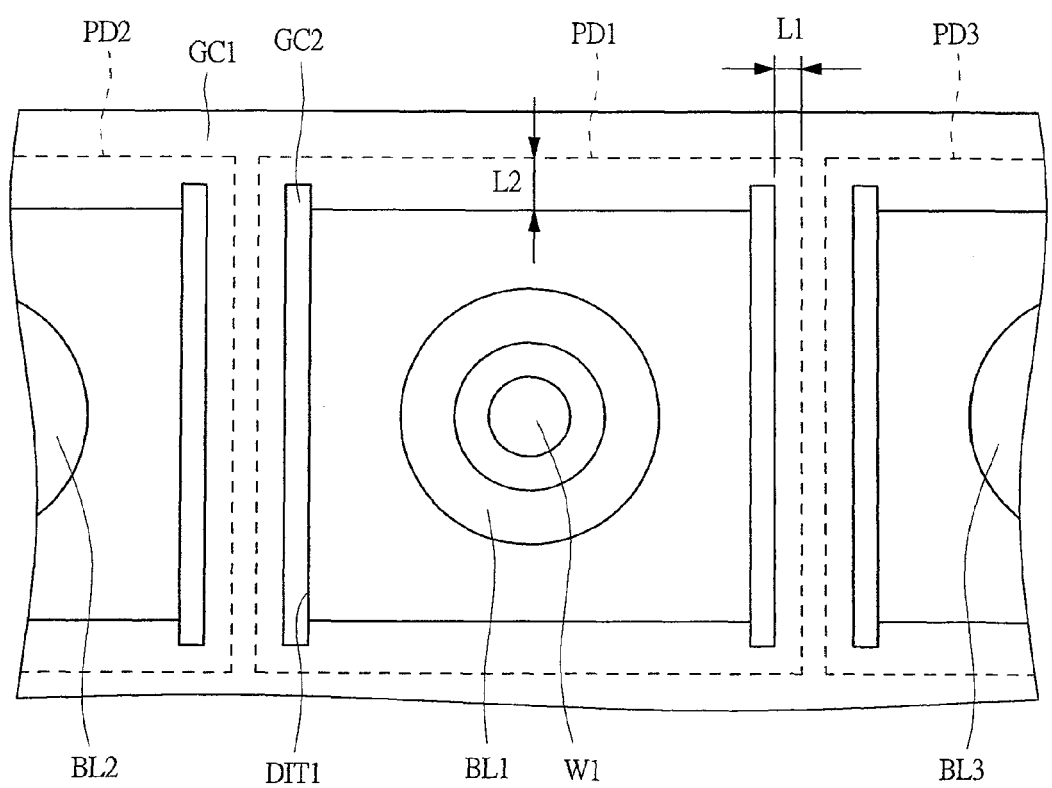
FIG. 28 is a diagram illustrating one example of another planar layout of the connection structure according to the third embodiment.

Next, a feature configuration regarding another planar layout of the connection structure according to the third embodiment will be described. FIG. 28 is a diagram illustrating one example of another planar layout of the connection structure according to the first embodiment. Since the planar layout illustrated in FIG. 28 has a structure substantially similar to that of the planar layout illustrated in FIG. 27, different points between the planar layouts will be mainly described. A feature of the planar layout in FIG. 28 lies in such a point that, for example, when the pad PD1 is focused, it is not that the trench DIT1 is formed along the whole coating region of the pad PD1 but that the trenches DIT1 are formed only in the inner region of the coating region parallel with some of the sides of the pad PD1 and the coating widths of the glass coat GC1 coating sides where the trench DIT1 is not formed are large. Specifically, as illustrated in FIG. 28, the trenches DIT1 are formed only on the side closest to the pad PD2 and the side closest to the pad PD3 of the four sides defining the outer shape of the pad PD1. Even in this case, short-circuit defect between the pad PD1 and the pad PD2 and short-circuit defect between the pad PD1 and the pad PD3 caused by the growth of the alloy layer can be effectively suppressed in the same manner as the above-described planar layout illustrated in FIG. 27.

Further, a feature of the planar layout illustrated in FIG. 28 lies in that a coating width L2 of the glass coat GC1 coating a side intersecting with the side closest to the pad PD2 or the side closest to the pad PD3 is larger than a coating width L1 of the glass coat GC1 coating the side closest to the pad PD2 or the side closest to the pad PD3. Thereby, since a coating amount of the glass coat GC1 coating the pad PD1 becomes large, for example, when a tensile force acts on the pad PD1 like a step of drawing out the wire W1 (looping step), a possibility that the pad PD1 is peeled off can be lowered, so that reliability improvement of the semiconductor device can be achieved. Especially, in the planar layout illustrated in FIG. 27, since the trench DIT1 is formed over the whole outer edge portion of the pad PD1, and the coating region formed on the outer edge portion of the pad PD1 is separated by the glass coat GC2 exposed on the bottom portion of the trench DIT1, the coating region hardly functions as deterrence to peeling-off of the pad when tensile force acts on the pad PD1. On the other hand, in the planar layout illustrated in FIG. 28, it is not that the trench DIT1 is formed along the whole coating region of the pad PD1 but that the trenches DIT1 are formed only in the inner region of the coating region parallel to some of the sides of the pad PD1, and the coating width of the glass coat GC1 coating the sides where the trench DIT1 is not formed is formed to be large. Therefore, in the planar layout illustrated in FIG. 28, such a merit that the coating region sufficiently functions as deterrence to peeling-off of the pad when tensile force acts on the pad PD1 can be obtained.

<Manufacturing Method of the Semiconductor Device According to the Third Embodiment>

The semiconductor device according to the third embodiment is configured in the above-described manner and a manufacturing method thereof will be described below.

Figure 29:
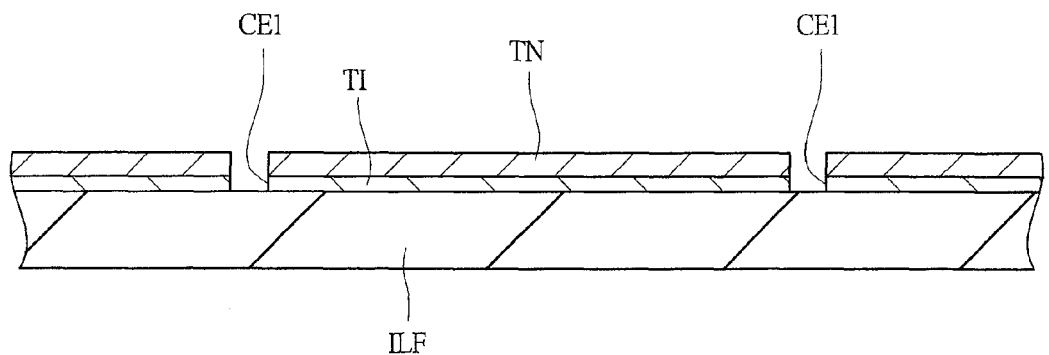
FIG. 29 is a cross-sectional view illustrating a step of a manufacturing process of a semiconductor device according to the third embodiment.

First, as illustrated in FIG. 29, a titanium film TI is formed on an interlayer insulating film ILF, and a titanium nitride film TN is formed on the titanium film TI. The titanium film TI and the titanium nitride film TN can be formed by using, for example, a sputtering method. Thereafter, the titanium film TI and the titanium nitride film TN are patterned by using the photolithography technique and the etching technique. Specifically, the titanium film TI and the titanium nitride film TN are worked so as to form gap portions CE1.

Figure 30:
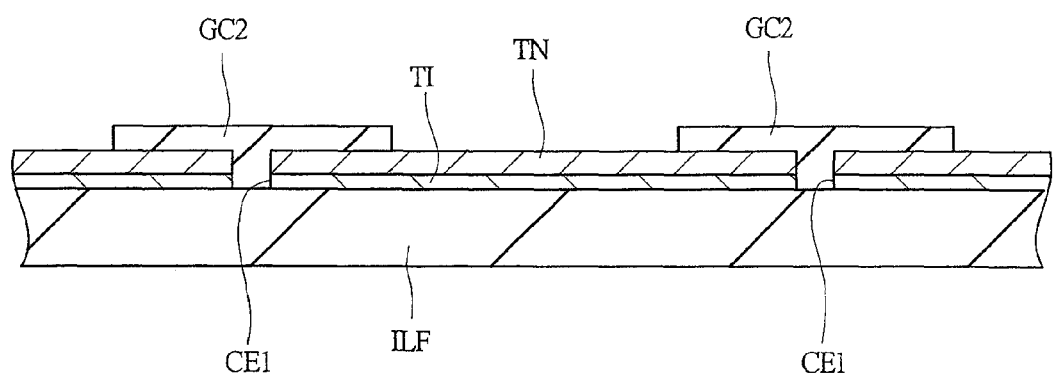
FIG. 30 is a cross-sectional view illustrating a step of the manufacturing process of a semiconductor device following the step illustrated in FIG. 29.

Subsequently, as illustrated in FIG. 30, an insulating film composed of, for example, a silicon oxide film or a silicon nitride film is formed so as to cover the titanium film TI and the titanium nitride film TN formed with the gap portions CE1. Then, the insulating film is patterned by using the photolithography technique and the etching technique. Thereby, the glass coat GC2 can be formed so as to be embedded into the gap portions CE1 and to coat an outer edge portion of the titanium nitride film TN.

Figure 31:
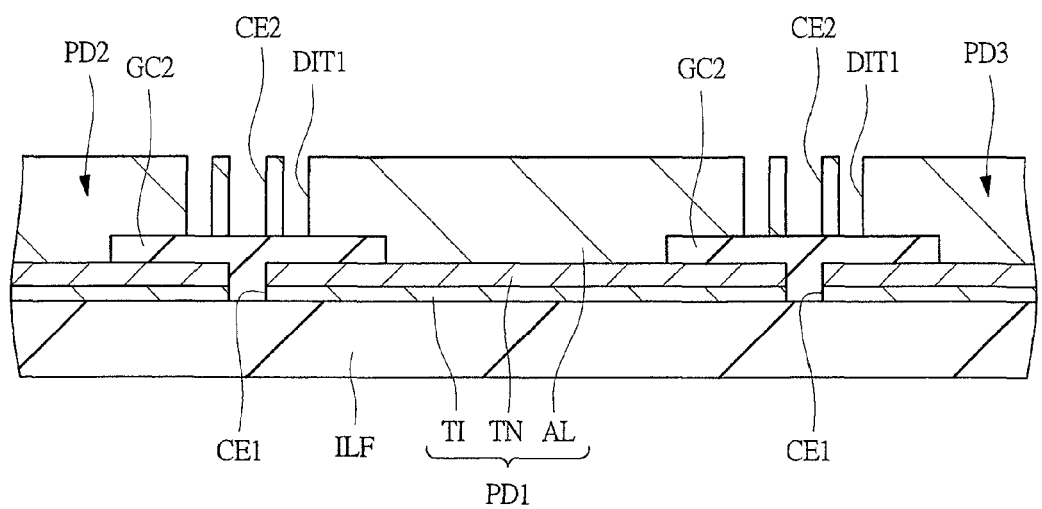
FIG. 31 is a cross-sectional view illustrating a step of the manufacturing process of a semiconductor device following the step illustrated in FIG. 30.

Next, as illustrated in FIG. 31, an aluminum film AL is formed on the titanium nitride film TN where the glass coat GC2 has been formed. The aluminum film AL can be formed by using, for example, a sputtering method. Then, the aluminum film AL is patterned by using a photolithography technique and an etching technique. The patterning of the aluminum film is performed so as to form gap portions CE2 and trenches DIT2. The gap portions CE2 and the trenches DIT2 are formed so as to expose the glass coat GC2 at their bottom portions. As a result, a plurality of pads PD1 to PD3 separated by the gap portions CE2 can be formed.

Figure 32:
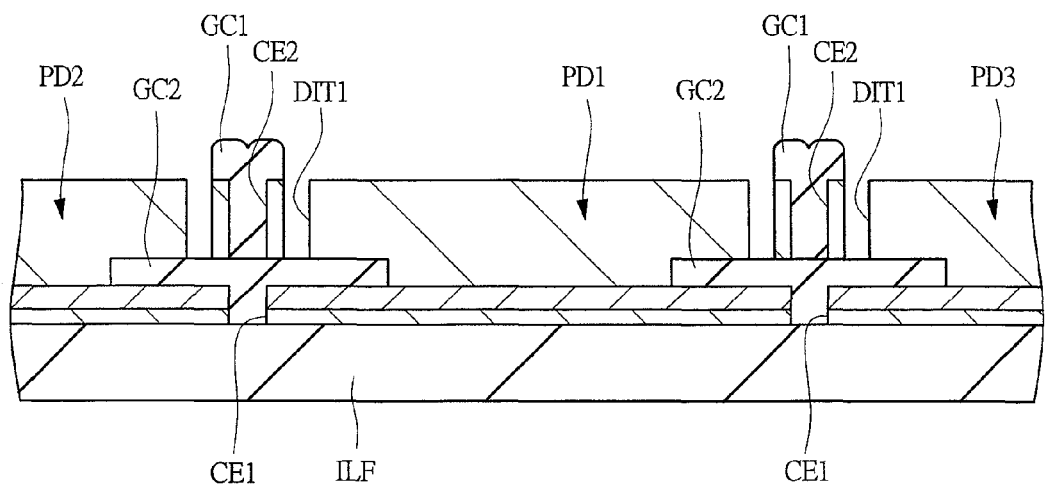
FIG. 32 is a cross-sectional view illustrating a step of the manufacturing process of a semiconductor device following the step illustrated in FIG. 31.

Thereafter, as illustrated in FIG. 32, an insulating film composed of, for example, a silicon oxide film or a silicon nitride film is formed on the patterned aluminum film AL, and the insulating film is patterned by using a photolithography technique and an etching technique. Thereby, a glass coat GC1 can be formed so as to be embedded in the gap portions CE2 formed in the aluminum film AL and to coat outer edge portions of the pads PD1 to PD3. At this time, the trenches DIT1 are arranged so as to be adjacent to the glass coat GC1. Steps performed thereafter are similar to those in the first embodiment. The semiconductor device in the third embodiment can be manufactured in this manner.

Fourth Embodiment

<Feature in the Fourth Embodiment>

Figure 33:
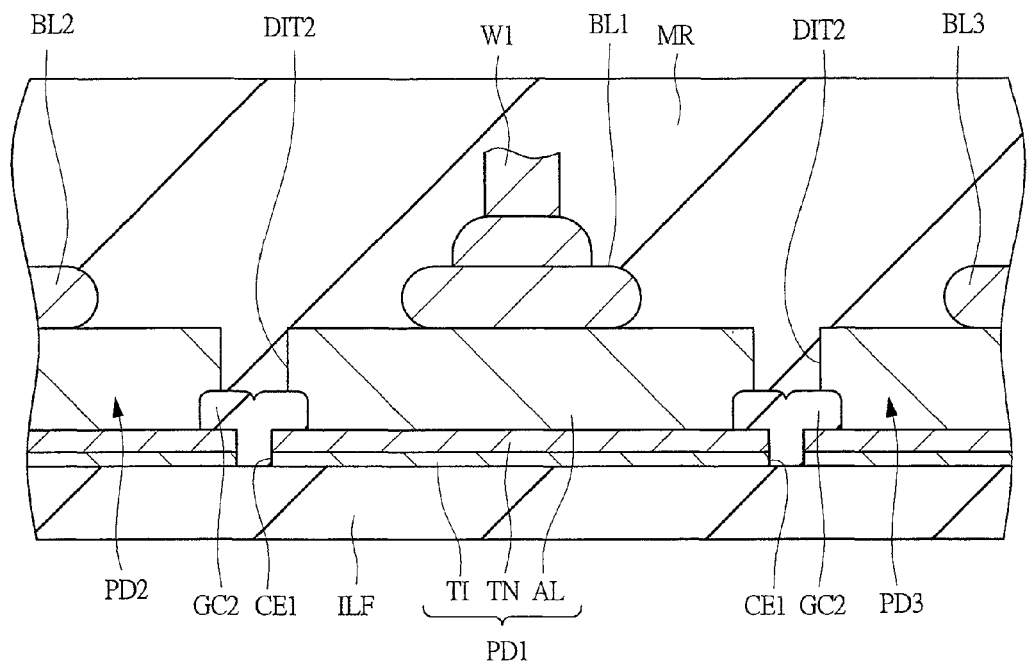
FIG. 33 is a cross-sectional view illustrating a connection structure between a pad and a metal wire according to a fourth embodiment.

FIG. 33 is a cross-sectional view illustrating a connection structure between a pad and a wire according to the fourth embodiment. Since the connection structure according to the fourth embodiment illustrated in FIG. 33 has a configuration substantially similar to that of the first embodiment illustrated in FIG. 12, different points between the connection structures are mainly described. In FIG. 33, a plurality of pads PD1 to PD3 are each constituted of a stacked film composed of a titanium film TI, a titanium nitride film TN, and an aluminum film AL. Here, in the present specification, a combined film of the titanium film TI and the titanium nitride film TN is called "lower layer film", while the aluminum film AL is called "upper layer film". In this case, in FIG. 33, a gap portion CE1 is formed between the lower layer film of the pad PD1 and the lower layer film of the pad PD2, and a glass coat GC2 is formed on an upper surface of a portion of the lower layer film of the pad PD1 and on an upper surface of a portion of the lower layer film of the pad PD2 from the inside of the gap portion CE1. The glass coat GC2 is composed of an insulating film such as, for example, a silicon oxide film or a silicon nitride film. The upper layer film composed of the aluminum film AL is formed over the lower layer film from an upper surface of the glass coat GC2. Trenches DIT2 are formed in the upper layer film formed on the glass coat GC2. At this time, the gap portion CE1 and the trench DIT2 are formed so as to overlap with each other in a plan view, and the width of the trench DIT2 is larger than the width of the gap portion CE1.

The main points of the pad structure according to the fourth embodiment thus configured will be summarized below. That is, the pad PD1 is composed of a first lower layer film (the titanium film TI and the titanium nitride film TN) and a first upper layer film (the aluminum film AL), and the pad PD2 is composed of a second lower layer film (the titanium film TI and the titanium nitride film TN) and a second upper layer film (the aluminum film AL). The gap portion CE1 is formed between the first lower layer film and the second lower layer film, and the glass coat GC2 is formed over the outer edge portion of the first lower layer film and the outer edge portion of the second lower layer film from the inside of the gap portion CE1. Further, the trench DIT2 composed of an end portion of the first upper layer film, an end portion of the second upper layer film, and a surface of the glass coat GC2 is formed on the glass coat GC2, and the width of the trench DIT2 is larger than the width of the gap portion CE1.

Here, a feature point of the fourth embodiment lies in such a point that the glass coat GC2 is directly in contact with the lower layer film forming the pad PD1 and the upper layer film composed of the aluminum film AL is not formed in the lower region of the glass coat GC2. Thereby, even if gold diffuses from the ball BL1 to the aluminum film AL, the aluminum film AL does not exist in the lower region of the glass coat GC2. Therefore, an alloy layer of gold and aluminum does not grow in the lower region of the glass coat GC2. Thereby, breaking of the glass coat GC2 separating the pad PD1 and the pad PD2 from each other can be prevented. That is, according to the fourth embodiment, breaking of the glass coat GC2 and short-circuit defect between the pad PD1 and the pad PD2 based upon the breaking of the glass coat GC2 can be reduced.

Incidentally, even in the fourth embodiment, since the region of the pad PD1 on which the alloy layer is formed and the pad PD2 adjacent to the pad PD1 can be made large, short-circuit defect between the pad PD1 and the pad PD2 can be suppressed even from this viewpoint.

<Planar Layout Configuration>

Figure 34:
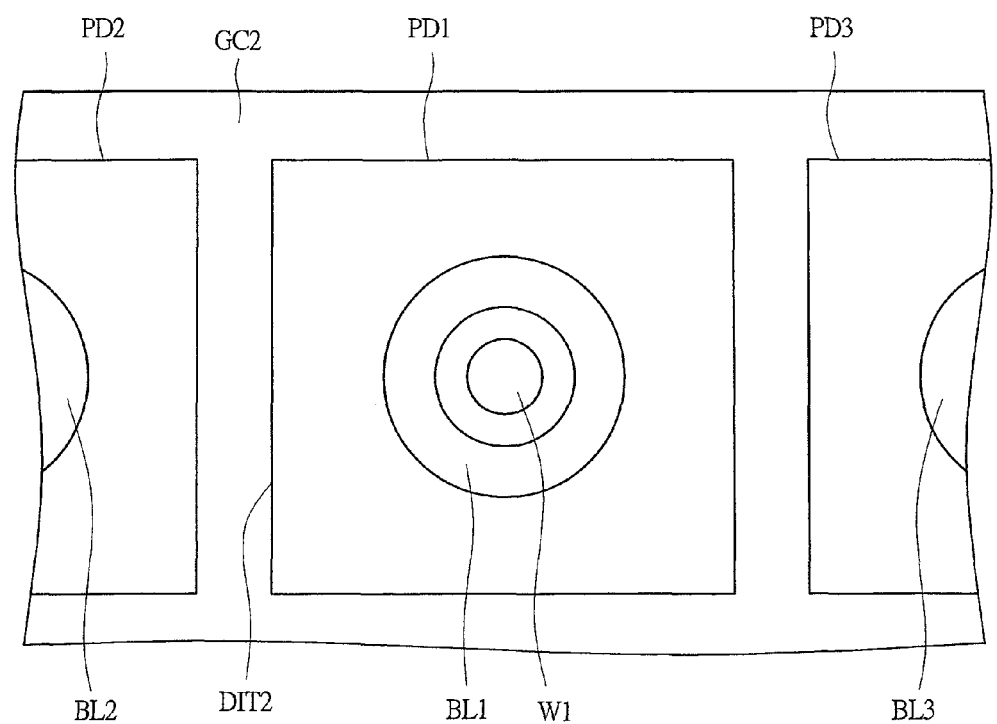
FIG. 34 is a diagram illustrating one example of a planar layout of the connection structure according to the fourth embodiment.

Next, a feature configuration regarding the planar layout of the connection structure according to the fourth embodiment will be described. FIG. 34 is a diagram illustrating one example of the planar layout of the connection structure according to the fourth embodiment. As illustrated in FIG. 34, rectangular pads PD1 to PD3 are arranged side by side in a lateral direction. For example, the outer shape of the pad PD1 is formed in a rectangular shape, and it has a first side closest to the pad PD2 and second sides intersecting with the first side. At this time, the whole outer edge portion of the pad PD1 is coated with the glass coat GC2. Specifically, as illustrated in FIG. 34, the trenches DIT2 defined by the end portions of the pads PD1 to PD3 and the surface of the glass coat GC2 are formed along the outer peripheral portions of the pads PD1 to PD3; and the glass coat GC2 exposed from the bottom portions of the trenches DIT2 is illustrated. That is, in the example of the planar layout illustrated in FIG. 34, the trench DIT2 is formed along the whole outer peripheral portion of the pad PD1. The inside of the trench DIT2 formed in the surrounding manner is an opening portion of the pad PD1, the ball BL1 is mounted on a central portion of the opening portion, and the wire W1 is connected on the ball BL1. Therefore, in the fourth embodiment, it is understood that the trench DIT2 is formed along the outer peripheral portion of the pad PD1 so as to surround the ball BL1.

<Manufacturing Method of the Semiconductor Device According to the Fourth Embodiment>

The semiconductor device according to the fourth embodiment is configured in the above manner and a manufacturing method thereof will be described below.

Figure 35:
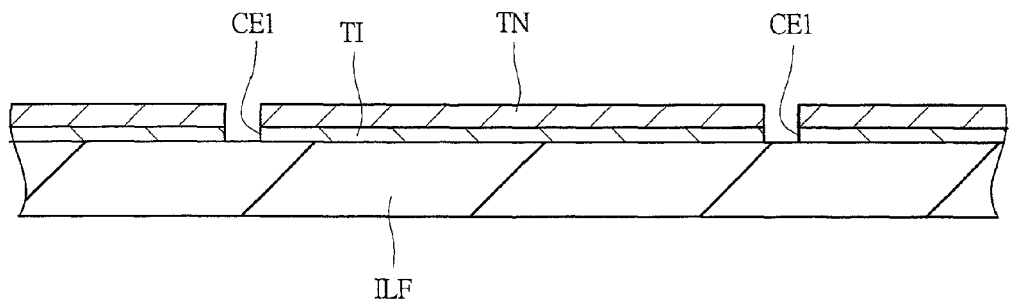
FIG. 35 is a cross-sectional view illustrating a step of a manufacturing process of a semiconductor device according to the fourth embodiment.

First, as illustrated in FIG. 35, a titanium film TI is formed on an interlayer insulating film ILF, and a titanium nitride film TN is formed on the titanium film TI. The titanium film TI and the titanium nitride film TN can be formed by using, for example, a sputtering method. Thereafter, the titanium film TI and the titanium nitride film TN are patterned by using the photolithography technique and the etching technique. Specifically, the titanium film TI and the titanium nitride film TN are processed so as to form gap portions CE1.

Figure 36:
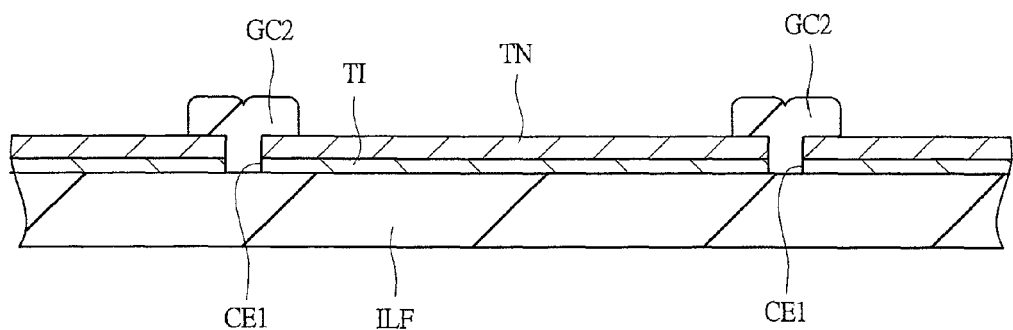
FIG. 36 is a cross-sectional view illustrating a step of the manufacturing process of a semiconductor device following the step illustrated in FIG. 35.

Subsequently, as illustrated in FIG. 36, an insulating film composed of, for example, a silicon oxide film or a silicon nitride film is formed so as to cover the titanium film TI and the titanium nitride film TN formed with the gap portions CE1. Then, the insulating film is patterned by using a photolithography technique and an etching technique. Thereby, a glass coat GC2 can be formed so as to be embedded into the gap portions CE1 and to coat an outer edge portion of the titanium nitride film TN.

Figure 37:
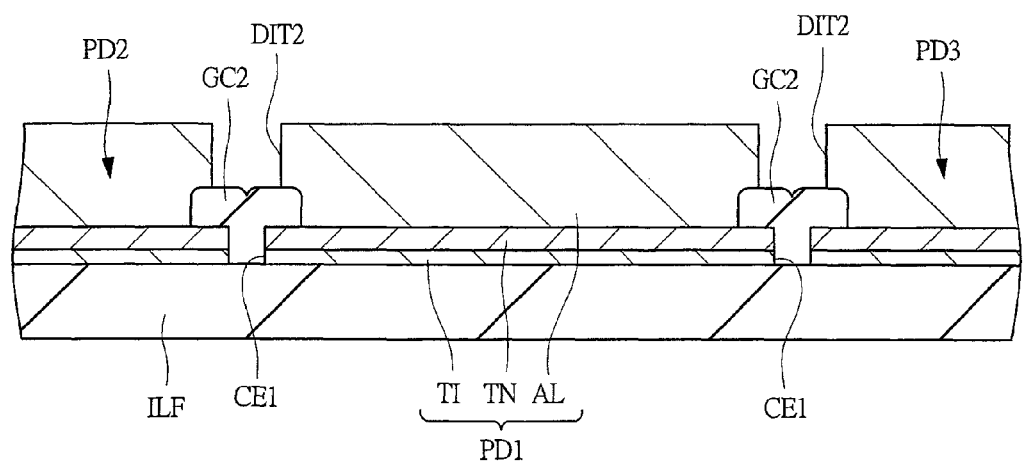
FIG. 37 is a cross-sectional view illustrating a step of the manufacturing process of a semiconductor device following the step illustrated in FIG. 36.

Next, as illustrated in FIG. 37, an aluminum film AL is formed on the titanium nitride film TN where the glass coat GC2 is formed. The aluminum film AL can be formed by using, for example, a sputtering method. Then, the aluminum film AL is patterned by using the photolithography technique and the etching technique. The patterning of the aluminum film AL is performed so as to form trenches DIT2. The trenches DIT2 are formed so as to expose the glass coat GC2 at their bottom portions. As a result, a plurality of pads PD1 to PD3 separated from one another by the gap portions CE2 can be formed. At this time, the trench DIT2 is formed so as to overlap with the gap portion CE1 in a plan view, and the width of the trench DIT2 is larger than that of the gap portion CE1. Steps performed thereafter are similar to those in the first embodiment. The semiconductor device in the fourth embodiment can be manufactured in this manner.

Fifth Embodiment

<Electric Characteristic Inspecting Step>

For example, in a manufacturing process of a semiconductor device, there is an electric characteristic inspecting step where whether or not an integrated circuit formed on a semiconductor wafer normally operates is tested in a state of the semiconductor wafer after the integrated circuit including a semiconductor element and multilayered wirings are formed on the semiconductor wafer.

Here, in the fifth embodiment, the electric characteristic inspecting step is focused. An integrated circuit including a semiconductor element and wiring layers is formed in each chip region of a semiconductor wafer, but dust, a flaw, or a stain are generated due to various causes in the above-described manufacturing process of a semiconductor device. When dust or a stain is attached to a semiconductor wafer or is taken in a resist film, an insulating film, a metal film or the like, patterning is not partially performed normally, which results in occurrence of a pattern defect. Further, in the ion-implanting technique, impurities are not normally introduced into a mixed portion of dust, a flaw or a stain, which results in abnormality of diffusion. Therefore, the semiconductor devices built in the chip regions of the semiconductor wafer may include one(s) which does (do) not operate normally due to the above-described pattern defect, diffusion abnormality, or abnormality of a semiconductor manufacturing apparatus.

Therefore, in the manufacturing process of a semiconductor device, an electric characteristic inspecting step for inspecting electric circuit characteristics of respective chip regions of a semiconductor wafer is performed in order to specify a chip region where the above-described defective integrated circuit is formed. According to the electric characteristic inspecting step, a chip region in which the defective integrated circuit is formed is marked as a defective product and is distinguished from chips where a normal integrated circuit is formed.

Figure 38:
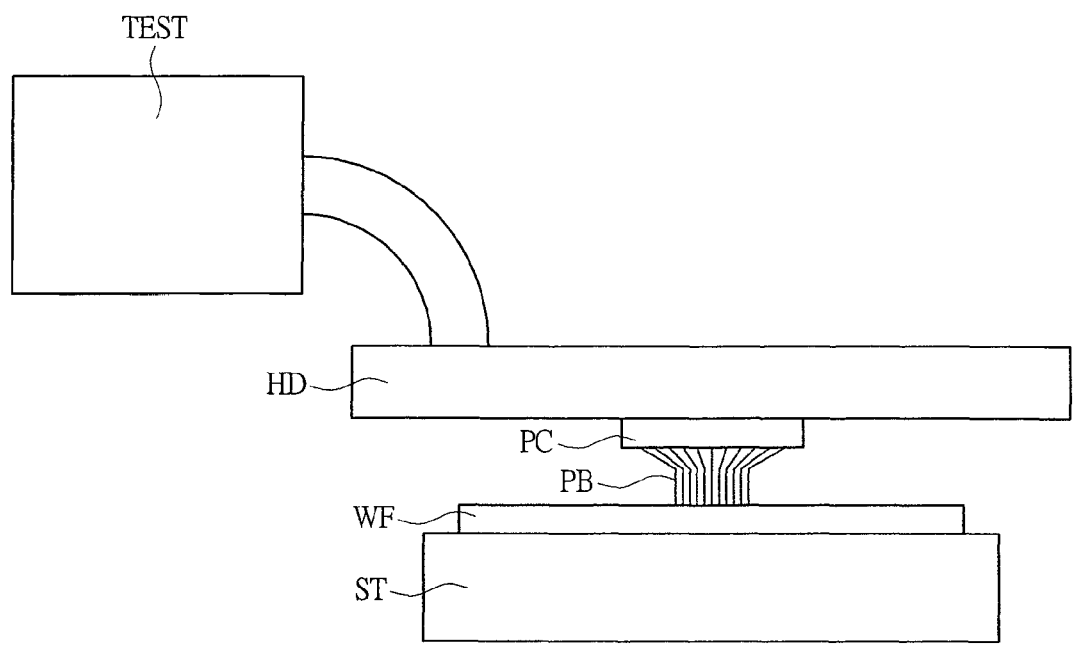
FIG. 38 is a diagram illustrating a configuration of an illustrative inspection apparatus for implementing an electric characteristic inspection.
Figure 39:
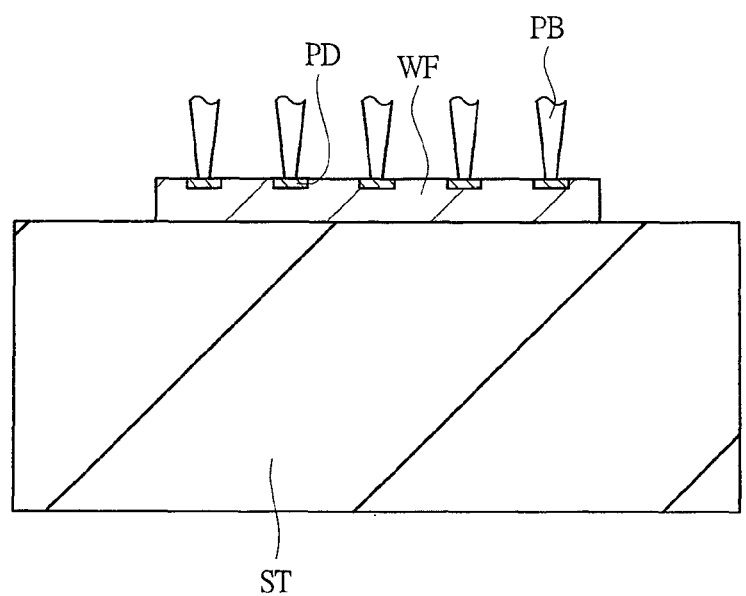
FIG. 39 is a diagram illustrating an aspect where probes are brought into contact with pads.

A specific electric characteristic inspection will be described below. FIG. 38 is a diagram illustrating an exemplified configuration of an inspection apparatus for performing an electric characteristic inspection. As illustrated in FIG. 38, first, a semiconductor wafer WF is set on a stage ST, and pads formed in each chip region of the semiconductor wafer WF are accurately aligned with the positions of tips of probes PB. Specifically, a probe card PC having many probes PB spaced out is used so as to correspond to the positions of a plurality of pads and the pads and the probes PB are electrically connected securely. The probe card PC is electrically connected to a tester TEST programmed with measurement items, a measurement order, decision criteria for good and bad, and the like via a test head HD. Electric signals are transmitted from the tester TEST via the probes PB into the integrated circuits formed in the semiconductor wafer from the pads. The electric signals are transmitted to the tester TEST from the pads via the integrated circuits as electric signals again, so that the circuit characteristics are inspected. Though the electric characteristic inspection is performed in the above-described manner, an important point in the electric characteristic inspection lies in such a point that the probes PB are brought into contact with the pads PD. That is, in the electric characteristic inspection, as illustrated in FIG. 39, it is necessary to press the probes PB onto the pads PD, but probe traces are formed on surfaces of the pads PD when the probes PB are pressed onto the pads PD. For example, a wire bonding step of mounting balls on surfaces of the pads PD and drawing out wires through the balls in the state that the probe traces have been formed on the surfaces of the pads PD in this manner exists. At this time, when the sizes of the pads PD are large and the diameter of the balls mounted on the pads PD are large, contact areas of the pads PD and the balls become large, so that, even if the probe traces exist on the surfaces of the pads PD, connection strengths between the pads PD and the balls are not affected so much by the probe traces. However, in recent years, density growth of the pads PD and size reduction of the pads have advanced and such a case that the sizes of the ball mounted on the pads PD become smaller according to the advance occurs. In this case, when the ball is brought into contact with the probe trace formed on the surface of the pad PD, there is a possibility that connection reliability between the pad PD and the ball is lowered due to the effect of the probe trace. From this point, for example, the surface region of the pad PD is separated into a ball-mounting region on which balls are mounted and a probe-contacting region with which a probe is brought into contact. Thereby, since balls can be mounted in the ball-mounting region where the probe trace does not exist on the pad PD, the connection reliability between the pad PD and the ball can be improved. In the fifth embodiment, the technical idea of the present invention is applied to the technique of separating the surface region of the pad PD into the ball-mounting region in which balls are mounted and the probe-contacting region with which a probe is brought into contact.

<Feature in the Fifth Embodiment>

Figure 40:
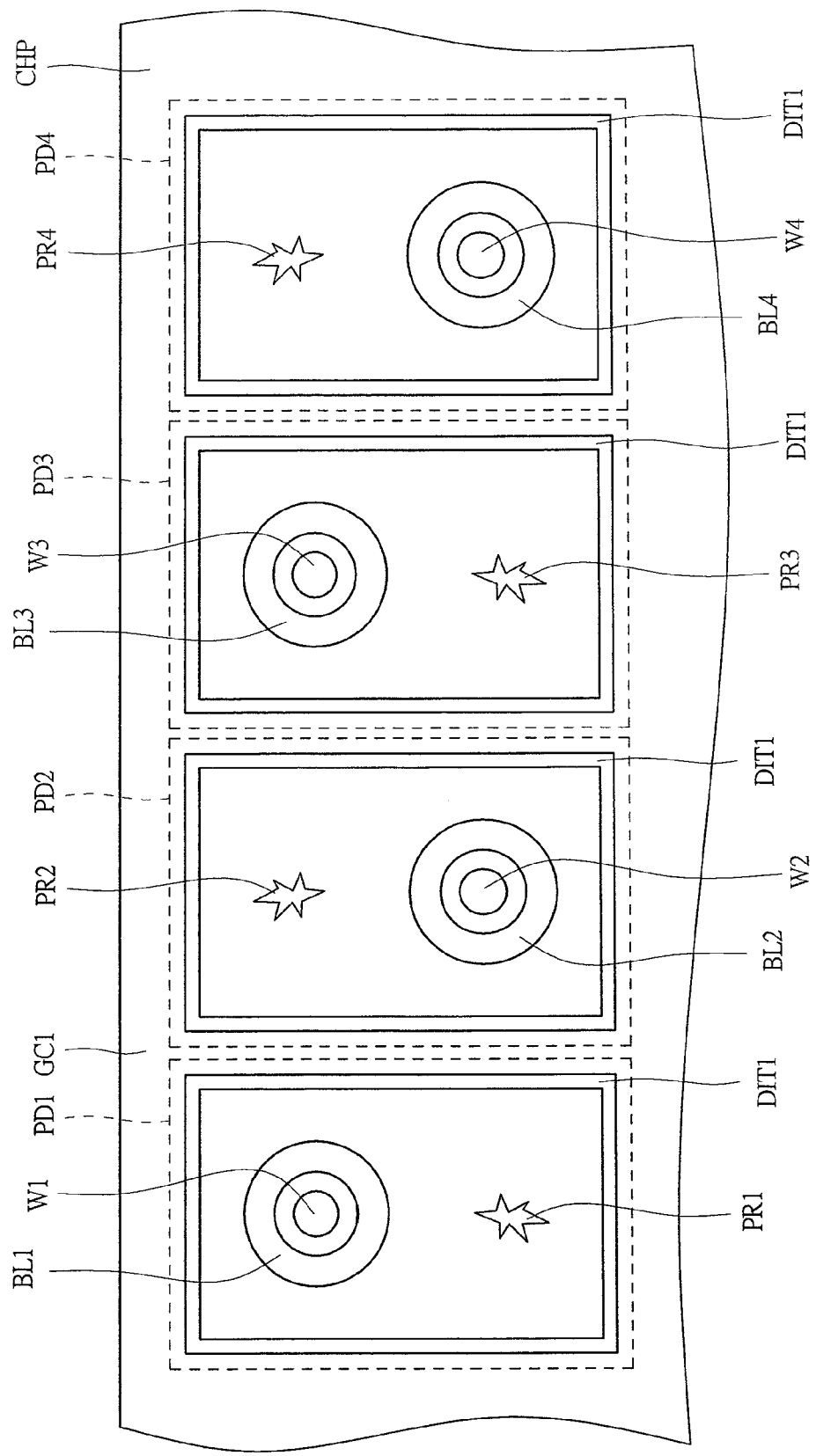
FIG. 40 is a diagram illustrating a connection structure between a pad and a metal wire according to a fifth embodiment.

FIG. 40 is a diagram illustrating the connection structure in the fifth embodiment. As illustrated in FIG. 40, a plurality of pads PD1 to PD4 are arranged on a semiconductor chip CHP side by side in a lateral direction. Ball-mounting regions mounted with balls BL1 to BL4, respectively, and probe-contacting regions contacted with probes are formed on the pads PD1 to PD4 so as to be separated from each other. Probe traces PR1 to PR4 which are traces of probe contact are formed in the probe-contacting regions.

Here, a feature of the fifth embodiment lies in such a point that ball-mounting positions formed on pads adjacent to each other are arranged in a staggered manner. That is, as illustrated in FIG. 40, for example, regarding the pad PD1, a ball BL1 is formed in an upper region of the pad PD1, and regarding the pad PD2, a ball BL2 is formed in a lower region of the pad PD2. Similarly, regarding the pad PD3, a ball BL3 is formed in an upper region of the pad PD3, and regarding the pad PD4, a ball BL4 is formed in a lower region of the pad PD4. Wires W1 to W4 are electrically connected to the respective balls BL1 to BL4.

As described above, in the fifth embodiment, as to the pads PD1 to PD4 arranged in line, it is not that the balls BL1 to BL4 are arranged inside the pads PD1 to PD4 in line but that adjacent balls are arranged in a staggered manner. In the present specification, the configuration in which adjacent balls are arranged in a staggered manner is called "in-pad staggered arrangement". That is, the in-pad staggered arrangement can be said to be a configuration where in the plurality of pads PD1 to PD4 arranged in line, the ball BL1 to BL4 arranged on the pads PD1 to PD4 are arranged in a plural-line fashion in a staggered manner. In other words, the in-pad staggered arrangement can be said to be an arrangement where balls are mounted in upper regions of predetermined pads of the pads PD1 to PD4 arranged in line while balls are mounted in lower regions of pads adjacent to the predetermined pads. Further, the in-pad staggered arrangement can be said to be an arrangement where the ball BL1 is closer to an outer edge portion (outer end portion) of the semiconductor chip CHP than the ball BL2 is in a plan view and it can be said to be an arrangement where the probe trace PR2 formed on the surface of the pad PD2 are closer to the outer edge portion (outer end portion) of the semiconductor chip CHP than the probe trace PR1 formed on the surface of the pad PD1 is in a plan view. That is, the in-pad staggered arrangement is used in not only the arrangements of the balls BL1 to BL4 but also arrangements of the probe traces PR1 to PR4.

Thus, in the fifth embodiment, since the in-pad staggered arrangement is adopted as arrangement of the balls BL1 to BL4, for example, a distance between adjacent balls can be made larger than that in the case where the balls BL1 to BL4 are arranged in line. This means that it become difficult for the alloy layers growing from adjacent balls concentrically to contact with each other. From this, in the fifth embodiment, it is understood that, by adopting the in-pad staggered arrangement in arrangement of the balls arranged within the pads, short-circuit defect between adjacent pads caused by growth of the alloy layers can be suppressed.

Further, even in the fifth embodiment, for example, when the pad PD1 is focused, the whole outer edge portion of the pad PD1 is coated with the glass coat GC1. Specifically, an outer shape periphery of the pad PD1 is illustrated by a broken line, from which, it is understood that the whole outer edge portion of the pad PD1 is coated with the glass coat GC1. That is, in FIG. 40, the glass coat GC1 is formed so as to coat the whole outer edge portion of the pad PD1, and coating widths of the glass coat GC1 coating respective four sides of the pad PD1 are equal to each other. As illustrated in FIG. 40, a trench DIT1 is formed in an inner region of a coating region, coated with the glass coat GC1, of the region of the pad PD1. That is, in the example of the planar layout illustrated in FIG. 40, the trench DIT1 is formed along the whole outer edge portion of the pad PD1. The inside of the trench DIT1 formed in the surrounding manner is an opening portion, the ball BL1 is mounted in a central region of the opening portion, and a wire W1 is connected on the ball BL1. Therefore, it is understood that the trench DIT1 is formed on the surface of the pad PD1 so as to surround the ball BL1.

Thus, even in the fifth embodiment, since the trench DIT1 is formed in the inner region of the coating region coated with the glass coat GC1, such growth of an alloy layer as to break through the glass coat GC1 can be suppressed according to the first mechanism and the second mechanism described in the first embodiment. From this, short-circuit defect between pads caused by growth of an alloy layer can be effectively suppressed according to the fifth embodiment. Especially, in the fifth embodiment, short-circuit defect between pads caused by growth of an alloy layer can be effectively suppressed according to a synergy effect of the configuration where the trench DIT1 is formed and the configuration where the in-pad staggered arrangement is adopted in arrangement of the balls.

<First Modification Example>

Figure 41:
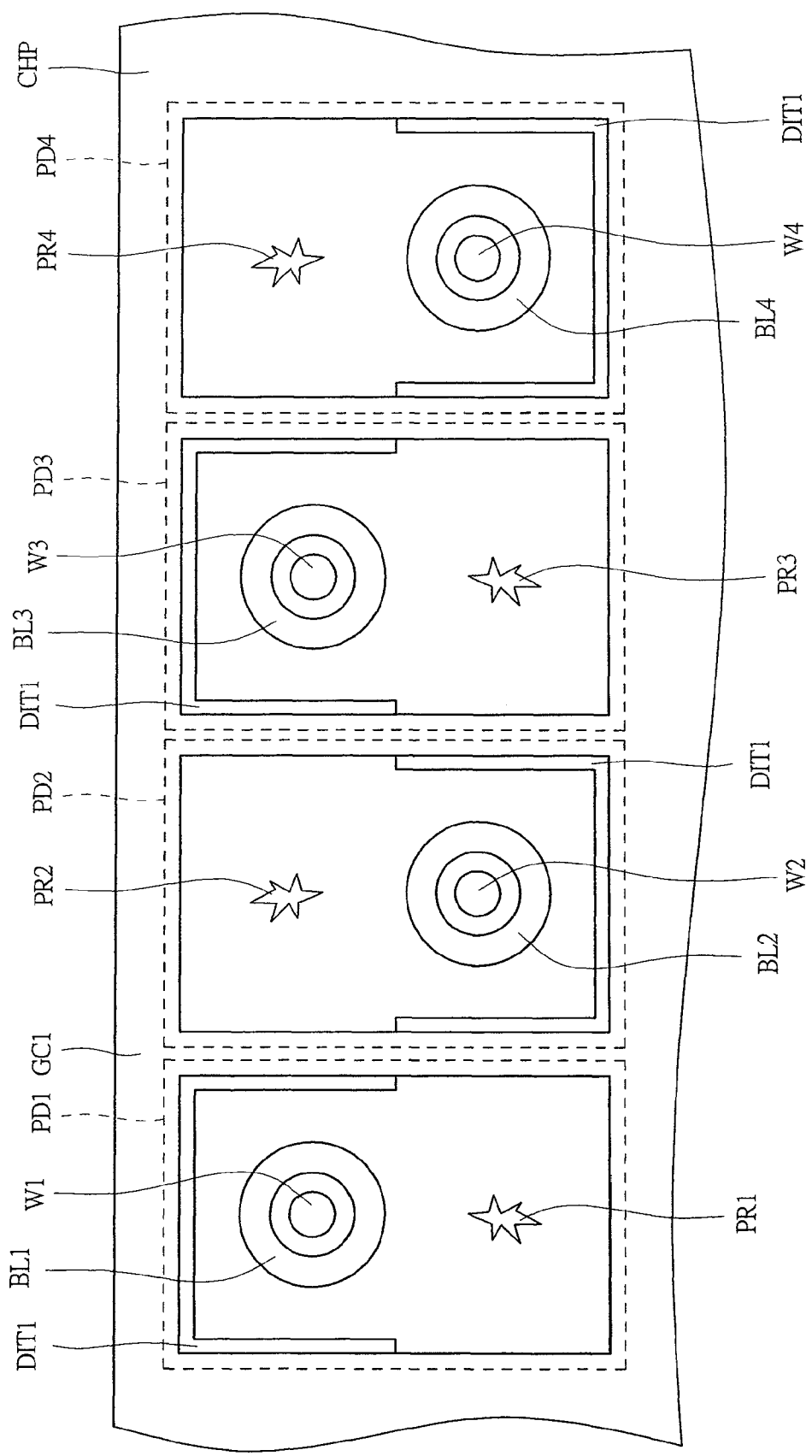
FIG. 41 is a diagram illustrating a connection structure between a pad and a metal wire according to a first modification example.

FIG. 41 is a diagram illustrating a connection structure in a first modification example. A different point between the connection structure illustrated in FIG. 41 and the connection structure illustrated in FIG. 40 lies in that the trench DIT1 is not formed in the probe-contacting region of the pad in the connection structure illustrated in FIG. 41. That is, in FIG. 41, although the trench DIT1 is formed on the ball-mounting region of the pad, the trench DIT1 is not formed in the probe-contacting region of the pad. In other words, it can be said that the trench DIT1 is not formed in a portion of the surface of the pad PD1 sandwiched between the probe trace PR1 on the surface of the pad PD1 and the pad PD2 in a plan view. Thereby, the area of the probe-contacting region becomes larger by an area obtained by no formation of the trench DIT1. As a result, according to the first modification example, for example, it is possible to obtain such an effect that a margin to a positional deviation when a probe is brought into contact with a pad can be made large in the electric characteristic inspecting step. On the other hand, even in FIG. 41, since the trench DIT1 is formed so as to surround the ball-mounting region and the in-pad staggered arrangement is adopted in arrangement of adjacent balls, short-circuit defect between pads caused by growth of an alloy layer can be effectively suppressed according to a synergy effect of the configuration where the trench DIT1 is formed and the configuration where the in-pad staggered arrangement is adopted in arrangement of the balls.

<Second Modification Example>

Figure 42:
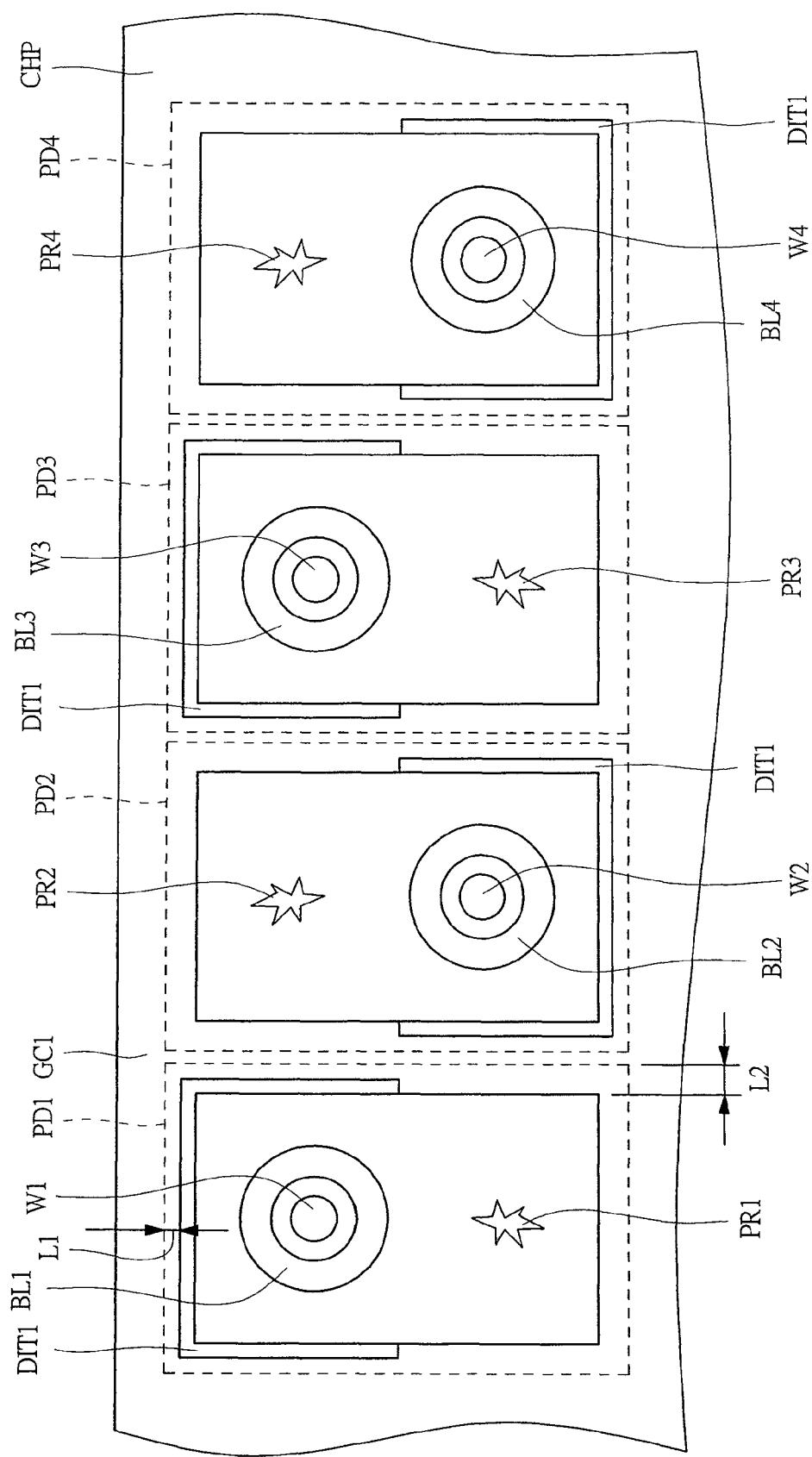
FIG. 42 is a diagram illustrating a connection structure between a pad and a metal wire according to a second modification example.

FIG. 42 is a diagram illustrating a connection structure in a second modification example. A different point between the connection structure illustrated in FIG. 42 and the connection structure illustrated in FIG. 41 lies in that the trench DIT1 is not formed in the probe-contacting region of the pad and the coating width L2 of the glass coat GC1 in the probe-contacting region is larger than the coating width L1 of the glass coat GC1 in the ball-mounting region in the connection structure illustrated in FIG. 42. That is, in FIG. 42, although the trench DIT1 is formed in the ball-mounting region of the pad, the trench DIT1 is not formed in the probe-contacting region of the pad. Then, the coating width L2 of the glass coat GC1 in the probe-contacting region of the pad is larger than the coating width L1 of the glass coat GC1 in the ball-mounting region by an area obtained by no formation of the trench DIT1. Thereby, according to the second modification example, the coating width L2 of the coating region coating the outer edge portion of the probe-contacting region of the pad can be made large. As a result, according to the second modification example, for example, even in such a case that a probe is caught by a pad so that tensile force acts on the pad when the probe is brought into contact with the pad at the electric characteristic inspecting step, the coating width L2 of the coating region coating the outer edge portion of the probe-contacting region of the pad is large, so that an effect capable of suppressing peeling-off of the pad due to the tensile force can be obtained. On the other hand, even in FIG. 42, since the trench DIT1 is formed so as to surround the ball-mounting region and the in-pad staggered arrangement is adopted in arrangement of adjacent balls, short-circuit defect between pads caused by growth of an alloy layer can be effectively suppressed according to a synergy effect of the configuration where the trench DIT1 is formed and the configuration where the in-pad staggered arrangement is adopted in arrangement of the balls.

Sixth Embodiment

<Feature in the Sixth Embodiment>

Figure 43:
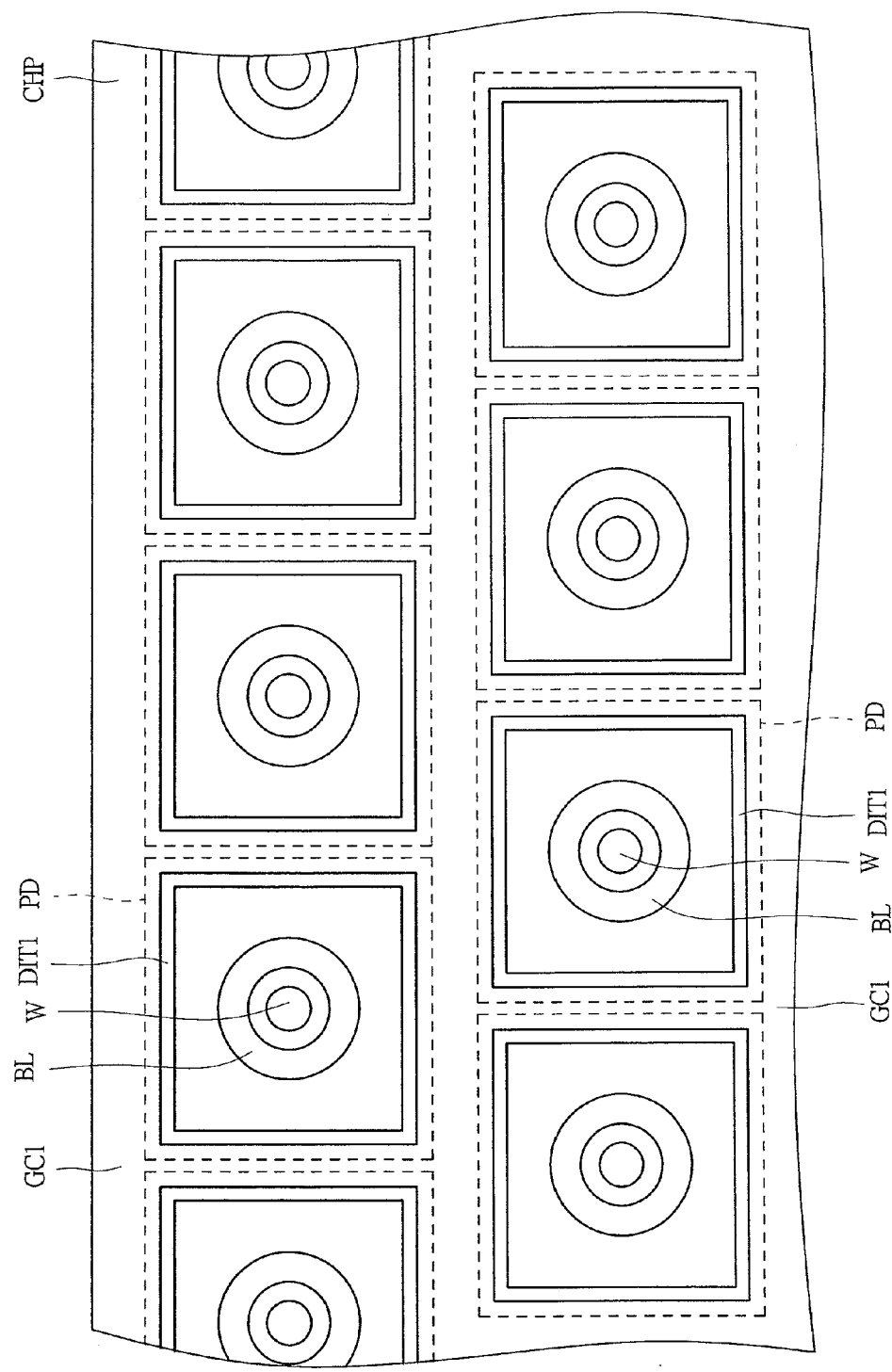
FIG. 43 is a diagram illustrating a connection structure between a pad and a metal wire according to a sixth embodiment.

FIG. 43 is a diagram illustrating a connection structure according to a sixth embodiment. As illustrated in FIG. 43, a plurality of pads PD are arranged on a semiconductor chip CHP side by side in a lateral direction. Specifically, as illustrated in FIG. 43, the plurality of pads PD are arranged in two lines, the pads PD arranged in a first line and the pads PD arranged in a second line are arranged in a staggered manner to each other. In the present specification, a configuration where the pads PD arranged in a plurality of lines are arranged in a staggered manner to each other is called "staggered arrangement". That is, the staggered arrangement can be said to be such a configuration that, on the assumption that pads PD are arranged in a plurality of lines, pads PD arranged in the respective lines are arranged in a staggered manner regarding adjacent lines. In other words, the staggered arrangement can be said to be an arrangement where the pads PD formed in a first line on the semiconductor chip CHP are arranged so as to be closer to the outer edge portion of the semiconductor chip CHP than the pads PD formed in a second line are in a plan view; and the centers of the pads PD formed in the first line and the centers of the pads PD formed in the second line are misaligned from each other.

In the connection structure according to the sixth embodiment, the whole outer edge portion of the pad PD is coated with the glass coat GC1. Specifically, an outer shape periphery of the pad PD1 is illustrated by a broken line, from which, it is understood that the whole outer edge portion of the pad is coated with the glass coat GC1. That is, in FIG. 43, the glass coat GC1 is formed so as to coat the whole outer edge portion of the pad PD, and the coating widths of the glass coat GC1 coating respective four sides of the pad PD are set to be equal to each other. As illustrated in FIG. 43, the trench DIT1 is formed in the inner region of the coating region, coated with the glass coat GC1, of the region of the pad PD. That is, in the example of the planar layout illustrated in FIG. 43, the trench DIT1 is formed along the whole outer edge portion of the pad PD. The inside of the trench DIT1 formed in the surrounding manner is an opening portion of the pad PD, a ball BL is mounted in a central region of the opening portion, and a wire W is connected onto the ball BL. Therefore, it is understood that the trench DIT1 is formed on the surface of the pad PD so as to surround the ball BL.

As described above, even in the sixth embodiment, since the trench DIT1 is formed in the inner region of the coating region coated with the glass coat GC1, such growth of an alloy layer as to break through the glass coat GC1 can be suppressed according to the first mechanism and the second mechanism described in the first embodiment. From this, short-circuit defect between pads caused by growth of an alloy layer can be effectively suppressed according to the sixth embodiment.

<Modification Example>

Figure 44:
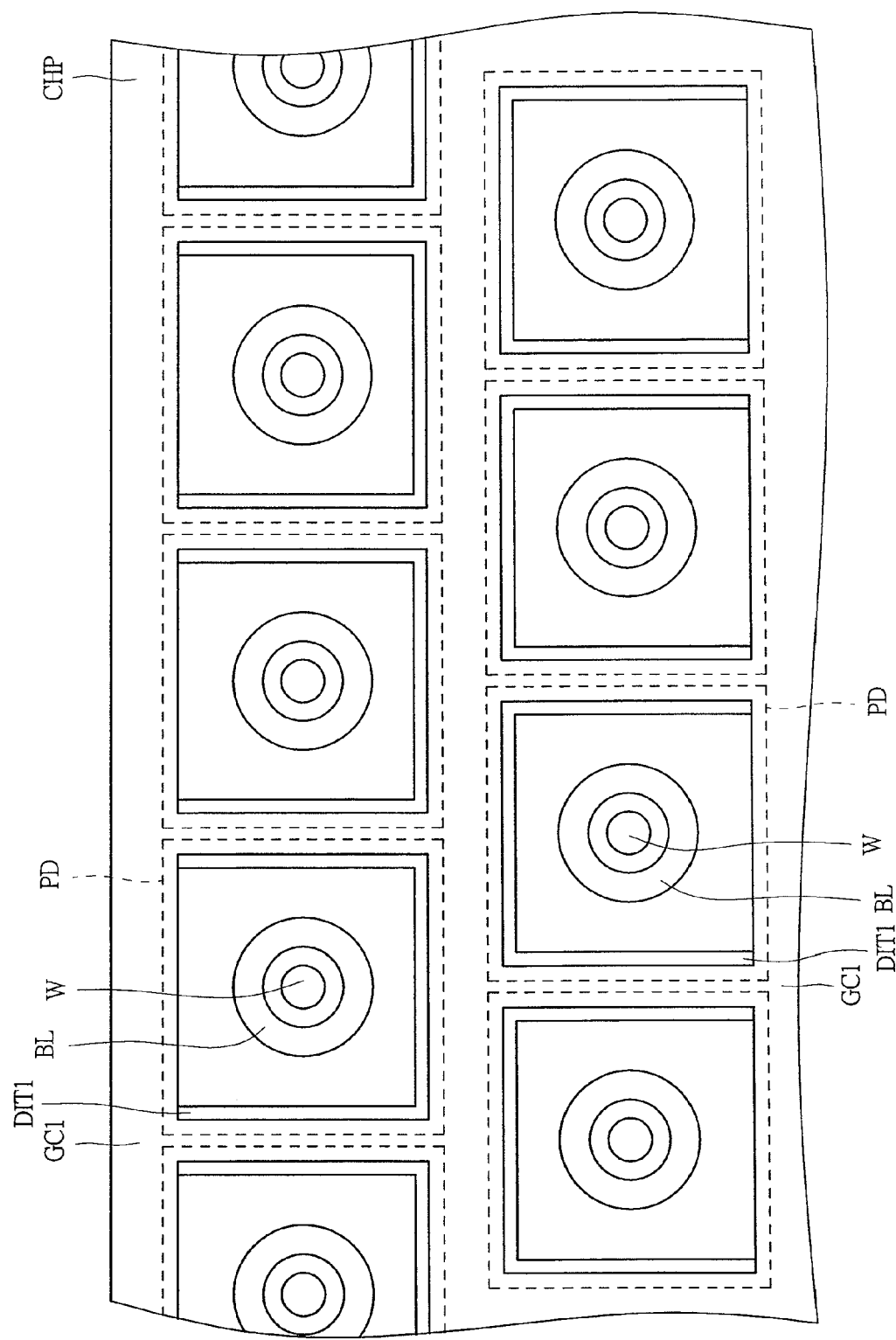
FIG. 44 is a diagram illustrating a connection structure between a pad and a metal wire according to a modification example.

FIG. 44 is a diagram illustrating a connection structure in a modification example. A different point between the connection structure illustrated in FIG. 44 and the connection structure illustrated in FIG. 43 lies in that the trench DIT1 is not formed along some of the sides of the pad PD in the connection structure illustrated in FIG. 44. That is, in FIG. 44, the staggered arrangement is adopted in arrangement of a plurality of pads PD, a plurality of pads PD are arranged in a first line close to an outer edge portion of a semiconductor chip CHP, and a plurality of pads PD are also arranged in a second line far from the outer edge portion of the semiconductor chip CHP. At this time, in the modification example, the trench DIT1 is not formed on upper sides of the pads PD arranged in the first line and the trench DIT1 is not formed on lower sides of the pads PD arranged in the second line. This is because alloy layers grow from balls BL concentrically but no adjacent balls exist in upward directions of the pads PD in the first line and in downward directions of the pads PD in the second line, so that even if alloy layers grow in the upward directions of the pad PD in the first line and in the downward directions of the pad PD in the second line, short-circuit defect is unlikely to occur. Thus, in the planar layout illustrated in FIG. 44, regarding the pads PD in the first line, the trenches DIT1 are formed on three sides of the sides of each of the pads PD except for the upper side close to the outer edge portion of the semiconductor chip CHP. Regarding the pads PD in the second line, the trenches DIT1 are formed on three sides of the sides of each of the pads PD except for the lower side far from the outer edge portion of the semiconductor chip CHP. Even in this case, short-circuit defect between pads PD caused by growth of an alloy layer can be effectively suppressed.

In the foregoing, the invention made by the inventors of the present invention has been concretely described based on the embodiments. However, it is needless to say that the present invention is not limited to the foregoing embodiments and various modifications and alterations can be made within the scope of the present invention.

Note that, the above-described MOSFET is not limited to the case where a gate insulating film is formed of an oxide film, and it is assumed that the MOSFET includes MISFET (Metal Insulator Semiconductor Field Effect Transistor) where the gate insulating film can be widely formed from an insulating film. That is, in the present specification, the term "MOSFET" is used for convenience sake, but the MOSFET is used in this specification as a term which is intended to include the MISFET, too.

The preset invention can be widely utilized in a manufacturing industry for manufacturing a semiconductor device.

What is claimed is:

1. A semiconductor device comprising:
(a) a semiconductor chip having a surface on which a first pad and a second pad adjacent to the first pad are arranged;
(b) a wiring member having an upper surface on which the semiconductor chip is mounted, a first external terminal electrically connected to the first pad of the semiconductor chip, and a second external terminal electrically connected to the second pad of the semiconductor chip;
(c) a first metal wire electrically connecting the first pad of the semiconductor chip and the first external terminal of the wiring member to each other;
(d) a second metal wire electrically connecting the second pad of the semiconductor chip and the second external terminal of the wiring member to each other; and
(e) a sealing body for sealing the semiconductor chip, a portion of the wiring member, the first metal wire, and the second metal wire,
wherein the first metal wire is electrically connected to the first pad via a first metal ball, and
a first trench is formed in a portion of a surface of the first pad sandwiched between the first metal ball and the second pad in a plan view.

2. The semiconductor device according to claim 1, wherein a portion of the sealing body is filled in the first trench.

3. The semiconductor device according to claim 2, wherein an insulating film is arranged between the first trench and the second pad in a plan view.

4. The semiconductor device according to claim 3, wherein the second metal wire is electrically connected to the second pad via a second metal ball, and
a second trench is formed in a portion of a surface of the second pad sandwiched between the second metal ball and the first pad in a plan view.

5. The semiconductor device according to claim 4, wherein the first metal ball is arranged so as to be closer to an outer edge portion of the semiconductor chip than the second metal ball is in a plan view.

6. The semiconductor device according to claim 5, wherein a probe trace of a surface of the second pad is closer to the outer edge portion of the semiconductor chip than a probe trace of a surface of the first pad is in a plan view.

7. The semiconductor device according to claim 6, wherein the first trench is not formed on a surface of the first pad sandwiched between the probe trace of the surface of the first pad and the second pad in a plan view.

8. The semiconductor device according to claim 5, wherein the first pad of the semiconductor chip is arranged to be closer to the outer edge portion of the semiconductor chip than the second pad is, and the center of the first pad and the center of the second pad are misaligned from each other in a plan view.

9. The semiconductor device according to claim 3, wherein the insulating film covers a surface of the first pad sandwiched between an end portion of the first pad and the first trench.

10. The semiconductor device according to claim 9, wherein the insulating film covers an outer edge portion of the first pad.

11. The semiconductor device according to claim 10, wherein the first pad is formed in a rectangular shape, and the first pad has a first side closest to the second pad and a second side intersecting with the first side.

12. The semiconductor device according to claim 11, wherein the first trench is formed along the first side, and a coating width of the insulating film coating the outer edge portion of the first pad along the first side and a coating width of the insulating film coating the outer edge portion of the first pad along the second side is equal to each other.

13. The semiconductor device according to claim 11, wherein the first trench is formed along the first side, and a coating width of the insulating film coating the outer edge portion of the first pad along the second side is larger than a coating width of the insulating film coating the outer edge portion of the first pad along the first side.

14. The semiconductor device according to claim 13, wherein the coating width of the insulating film coating the outer edge portion of the first pad along the second side is larger than the coating width of the insulating film coating the outer edge portion of the first pad along the first side by a length corresponding to a width of the first trench.

15. The semiconductor device according to claim 1, wherein the semiconductor chip has a third pad adjacent to the first pad, and
the first trench is also formed in a portion of the surface of the first pad sandwiched between the first metal ball and the third pad in a plan view.

16. The semiconductor device according to claim 15, wherein the first trench is formed on the surface of the first pad so as to surround the first metal ball.

17. The semiconductor device according to claim 1, wherein a portion of an insulating film is disposed in the first trench.

18. The semiconductor device according to claim 1, wherein the first metal ball is formed of gold, and a surface of the first pad is formed of aluminum.

19. The semiconductor device according to claim 1, wherein the wiring member is separated from the first external terminal and the second external terminal and includes a chip-mounting portion on which the semiconductor chip is mounted, and the first external terminal and the second external terminal are lead terminals.

20. The semiconductor device according to claim 1, wherein the wiring member is a wiring board, and the first external terminal and the second external terminal are ball terminals.

21. The semiconductor device according to claim 3, wherein the insulating film is one of a silicon nitride film and a silicon oxide film.

22. A semiconductor device comprising:
(a) a semiconductor chip having a surface on which a first aluminum pad and a second aluminum pad adjacent to the first aluminum pad are arranged;
(b) a wiring member having an upper surface on which the semiconductor chip is mounted, a first external terminal electrically connected to the first aluminum pad of the semiconductor chip, and a second external terminal electrically connected to the second aluminum pad of the semiconductor chip;
(c) a first gold wire electrically connecting the first aluminum pad of the semiconductor chip and the first external terminal of the wiring member to each other;

(d) a second gold wire electrically connecting the second aluminum pad of the semiconductor chip and the second external terminal of the wiring member to each other; and (e) a sealing body for sealing the semiconductor chip, a portion of the wiring member, the first gold wire, and the second gold wire, wherein the first gold wire is electrically connected to the first aluminum pad via a first gold ball, and a trench is formed in a portion of a surface of the first aluminum pad sandwiched between the first gold ball and the second aluminum pad in a plan view.

23. A semiconductor device comprising:

(a) a semiconductor chip having a surface on which a first pad and a second pad adjacent to the first aluminum pad are arranged;

(b) a wiring member having an upper surface on which the semiconductor chip is mounted, a first external terminal electrically connected to the first pad of the semiconductor chip, and a second external terminal electrically connected to the second pad of the semiconductor chip;

(c) a first metal wire electrically connecting the first pad of the semiconductor chip and the first external terminal of the wiring member to each other;

(d) a second metal wire electrically connecting the second pad of the semiconductor chip and the second external terminal of the wiring member to each other; and (e) a sealing body for sealing the semiconductor chip, a portion of the wiring member, the first metal wire, and the second metal wire, wherein the first metal wire is electrically connected to the first pad via a first metal ball, a trench is formed in a portion of a surface of the first pad sandwiched between the first metal ball and the second pad in a plan view, a first step portion is formed at an end portion of the first pad, a second step portion is formed at an end portion of the second pad, and an insulating film is formed between the first step portion and the second step portion.

24. A semiconductor device comprising:

(a) a semiconductor chip having a surface on which a first pad and a second pad adjacent to the first aluminum pad are arranged;

(b) a wiring member having an upper surface on which the semiconductor chip is mounted, a first external terminal electrically connected to the first pad of the semiconductor chip, and a second external terminal electrically connected to the second pad of the semiconductor chip;

(c) a first metal wire electrically connecting the first pad of the semiconductor chip and the first external terminal of the wiring member to each other;

(d) a second metal wire electrically connecting the second pad of the semiconductor chip and the second external terminal of the wiring member to each other; and (e) a sealing body for sealing the semiconductor chip, a portion of the wiring member, the first metal wire, and the second metal wire, wherein the first metal wire is electrically connected to the first pad via a first metal ball, the first pad is composed of a first lower layer film and a first upper layer film, the second pad is composed of a second lower layer film and a second upper layer film, a gap portion is provided between the first lower layer film and the second lower layer film, an insulating film is formed over an outer edge portion of the first lower layer film and an outer edge portion of the second lower layer film from inside of the gap portion, a trench composed of an end portion of the first upper layer film, an end portion of the second upper layer film, and a surface of the insulating film is formed on the insulating film, and a width of the trench is larger than a width of the gap portion.

* * * * *

UNITED STATES PATENT AND TRADEMARK OFFICE
CERTIFICATE OF CORRECTION

PATENT NO.      : 8,686,573 B2
APPLICATION NO. : 13/767267
DATED           : April 1, 2014
INVENTOR(S)     : Shin et al.

Page 1 of 1

It is certified that error appears in the above-identified patent and that said Letters Patent is hereby corrected as shown below:

In the Claims

Claim 23, Column 37, Line 15, "the first aluminum pad" should read --the first pad--;

Claim 24, Column 38, Line 5, "the first aluminum pad" should read --the first pad--.

Signed and Sealed this
Twenty-fifth Day of August, 2015

Michelle K. Lee
*Director of the United States Patent and Trademark Office*